(12) United States Patent
Bubel et al.

(10) Patent No.: US 11,654,596 B2
(45) Date of Patent: *May 23, 2023

(54) SILICON CARBIDE WAFERS WITH RELAXED POSITIVE BOW AND RELATED METHODS

(71) Applicant: Wolfspeed, Inc., Durham, NC (US)

(72) Inventors: Simon Bubel, Carrboro, NC (US); Matthew Donofrio, Raleigh, NC (US); John Edmond, Durham, NC (US); Ian Currier, Wake Forest, NC (US)

(73) Assignee: WOLFSPEED, INC., Durham, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 17/178,532

(22) Filed: Feb. 18, 2021

(65) Prior Publication Data

US 2021/0170632 A1 Jun. 10, 2021

Related U.S. Application Data

(63) Continuation of application No. 16/784,311, filed on Feb. 7, 2020, now Pat. No. 11,034,056, which is a
(Continued)

(51) Int. Cl.
*B28D 5/00* (2006.01)
*H01L 29/16* (2006.01)

(52) U.S. Cl.
CPC ........ *B28D 5/0011* (2013.01); *H01L 29/1608* (2013.01)

(58) Field of Classification Search
CPC ............................ B28D 5/0011; H01L 29/1608
See application file for complete search history.

(56) References Cited

U.S. PATENT DOCUMENTS

3,105,623 A 10/1963 Hobbs
3,112,850 A 12/1963 Garibotti
(Continued)

FOREIGN PATENT DOCUMENTS

CN 1973375 A 5/2007
CN 101400475 A 4/2009
(Continued)

OTHER PUBLICATIONS

Jan Richter; Cold Split Provides Significant Cost Advantages for SiC Substrates and Devices; https://eepower.com/technical-articles/cold-split-provides-significant-cost-advantages-for-sic-substrates-and-devices/#; Sep. 4. 2017 (Year: 2017).*
(Continued)

*Primary Examiner* — Syed I Gheyas
(74) *Attorney, Agent, or Firm* — Dority & Manning, P.A.

(57) ABSTRACT

Silicon carbide (SiC) wafers and related methods are disclosed that include intentional or imposed wafer shapes that are configured to reduce manufacturing problems associated with deformation, bowing, or sagging of such wafers due to gravitational forces or from preexisting crystal stress. Intentional or imposed wafer shapes may comprise SiC wafers with a relaxed positive bow from silicon faces thereof. In this manner, effects associated with deformation, bowing, or sagging for SiC wafers, and in particular for large area SiC wafers, may be reduced. Related methods for providing SiC wafers with relaxed positive bow are disclosed that provide reduced kerf losses of bulk crystalline material. Such methods may include laser-assisted separation of SiC wafers from bulk crystalline material.

24 Claims, 12 Drawing Sheets

Related U.S. Application Data continuation of application No. 16/415,721, filed on May 17, 2019, now Pat. No. 10,611,052.

(56) References Cited

U.S. PATENT DOCUMENTS

| | | |
|---|---|---|
| 3,970,819 A | 7/1976 | Gates et al. |
| 4,224,101 A | 9/1980 | Tijburg et al. |
| 5,597,767 A | 1/1997 | Mignardi et al. |
| 5,761,111 A | 6/1998 | Glezer |
| 5,786,560 A | 7/1998 | Fatah et al. |
| 5,912,477 A | 6/1999 | Negley |
| 5,916,460 A | 6/1999 | Imoto et al. |
| 5,922,224 A | 7/1999 | Broekroelofs |
| 5,968,382 A | 10/1999 | Matsumoto et al. |
| 6,087,617 A | 7/2000 | Troitski et al. |
| 6,555,781 B2 | 4/2003 | Ngoi et al. |
| 6,958,093 B2 | 10/2005 | Vaudo et al. |
| 6,992,026 B2 | 1/2006 | Fukuyo et al. |
| 7,547,578 B2 | 6/2009 | Agarwal et al. |
| 7,547,897 B2 | 6/2009 | Suvorov |
| 7,566,635 B2 | 7/2009 | Fujii et al. |
| 7,592,237 B2 | 9/2009 | Sakamoto et al. |
| 7,605,344 B2 | 10/2009 | Fukumitsu |
| 7,608,214 B2 | 10/2009 | Kuno et al. |
| 7,709,767 B2 | 5/2010 | Sakamoto |
| 7,718,510 B2 | 5/2010 | Sakamoto et al. |
| 7,749,867 B2 | 7/2010 | Fukuyo et al. |
| 7,754,583 B2 | 7/2010 | Sakamoto |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 8,026,154 B2 | 9/2011 | Sakamoto |
| 8,058,103 B2 | 11/2011 | Fukumitsu et al. |
| 8,084,333 B2 | 12/2011 | Sakamoto |
| 8,110,422 B2 | 2/2012 | Kumagai et al. |
| 8,134,099 B2 | 3/2012 | Nakano et al. |
| 8,138,450 B2 | 3/2012 | Sakamoto et al. |
| 8,188,404 B2 | 5/2012 | Sakamoto |
| 8,247,311 B2 | 8/2012 | Sakamoto et al. |
| 8,247,734 B2 | 8/2012 | Fukuyo et al. |
| 8,263,479 B2 | 9/2012 | Fukuyo et al. |
| 8,278,592 B2 | 10/2012 | Sakamoto |
| 8,288,220 B2 | 10/2012 | Hull et al. |
| 8,389,384 B2 | 3/2013 | Sakamoto et al. |
| 8,436,273 B2 | 5/2013 | Sakamoto |
| 8,513,567 B2 | 8/2013 | Osajima et al. |
| 8,523,636 B2 | 9/2013 | Uchiyama |
| 8,541,251 B2 | 9/2013 | Uchiyama |
| 8,603,351 B2 | 12/2013 | Sakamoto et al. |
| 8,604,383 B2 | 12/2013 | Kuno et al. |
| 8,624,153 B2 | 1/2014 | Atsumi et al. |
| 8,685,838 B2 | 4/2014 | Fukuyo et al. |
| 8,722,516 B2 | 5/2014 | Yamada et al. |
| 8,728,914 B2 | 5/2014 | Sakamoto et al. |
| 8,735,770 B2 | 5/2014 | Kuno et al. |
| 8,735,771 B2 | 5/2014 | Kuno et al. |
| 8,755,107 B2 | 6/2014 | Sakamoto et al. |
| 8,790,997 B2 | 7/2014 | Nakagawa et al. |
| 8,816,245 B2 | 8/2014 | Iwaki et al. |
| 8,828,306 B2 | 9/2014 | Uchiyama |
| 8,828,891 B2 | 9/2014 | Sakamoto |
| 8,890,026 B2 | 11/2014 | Uchiyama et al. |
| 8,933,368 B2 | 1/2015 | Atsumi et al. |
| 8,946,055 B2 | 2/2015 | Sakamoto et al. |
| 8,950,217 B2 | 2/2015 | Iwaki et al. |
| RE45,403 E | 3/2015 | Kumagai |
| 8,969,752 B2 | 3/2015 | Fukumitsu et al. |
| 8,980,445 B2 | 3/2015 | Leonard et al. |
| 8,993,922 B2 | 3/2015 | Atsumi et al. |
| 9,012,805 B2 | 4/2015 | Atsumi et al. |
| 9,035,216 B2 | 5/2015 | Sugiura |
| 9,076,855 B2 | 7/2015 | Sugiura |
| 9,102,005 B2 | 8/2015 | Muramatsu et al. |
| 9,200,381 B2 | 12/2015 | Leonard et al. |
| 9,295,969 B2 | 3/2016 | Okuma et al. |
| 9,302,410 B2 | 4/2016 | Shimoi et al. |
| 9,481,051 B2 | 11/2016 | Hirata et al. |
| 9,517,530 B2 | 12/2016 | Hirata et al. |
| 9,764,420 B2 | 9/2017 | Hirata et al. |
| 9,764,428 B2 | 9/2017 | Hirata et al. |
| 9,768,259 B2 | 9/2017 | Suvorov et al. |
| 9,789,565 B2 | 10/2017 | Hirata et al. |
| 9,790,619 B2 | 10/2017 | Leonard et al. |
| 9,868,177 B2 | 1/2018 | Hirata |
| 9,878,397 B2 | 1/2018 | Hirata et al. |
| 9,925,619 B2 | 3/2018 | Hirata et al. |
| 10,155,323 B2 | 12/2018 | Hirata |
| 10,201,907 B2 | 2/2019 | Hirata |
| 10,357,851 B2 | 7/2019 | Nishino et al. |
| 10,406,635 B2 | 9/2019 | Hirata |
| 10,562,130 B1 | 2/2020 | Donofrio et al. |
| 10,576,585 B1 | 3/2020 | Donofrio et al. |
| 10,611,052 B1 | 4/2020 | Bubel et al. |
| 10,867,797 B2 | 12/2020 | Suvorov et al. |
| 11,024,501 B2 | 6/2021 | Donofrio et al. |
| 2001/0054606 A1 | 12/2001 | Weishauss et al. |
| 2002/0104478 A1 | 8/2002 | Oguri et al. |
| 2005/0048738 A1 | 3/2005 | Shaheen et al. |
| 2010/0289189 A1 | 11/2010 | Lichtensteiger et al. |
| 2011/0266261 A1 | 11/2011 | Nakano et al. |
| 2011/0312115 A1 | 12/2011 | Kato |
| 2011/0316003 A1 | 12/2011 | Murphy et al. |
| 2012/0000415 A1 | 1/2012 | D'Evelyn et al. |
| 2012/0061356 A1 | 3/2012 | Fukumitsu |
| 2012/0234808 A1 | 9/2012 | Nakano et al. |
| 2012/0234887 A1 | 9/2012 | Henley et al. |
| 2014/0038392 A1 | 2/2014 | Yonehara et al. |
| 2014/0087504 A1 | 3/2014 | Li et al. |
| 2014/0197419 A1 | 7/2014 | Henley et al. |
| 2014/0251963 A1 | 9/2014 | Kawaguchi |
| 2014/0360988 A1 | 12/2014 | Sato |
| 2015/0068446 A1* | 3/2015 | Drachev ............... C30B 23/025 156/60 |
| 2015/0075221 A1 | 3/2015 | Kawaguchi et al. |
| 2015/0158117 A1 | 6/2015 | Munoz et al. |
| 2015/0171045 A1 | 6/2015 | Berger et al. |
| 2015/0174698 A1 | 6/2015 | Tajikara et al. |
| 2015/0217399 A1 | 8/2015 | Tajikara et al. |
| 2015/0217400 A1 | 8/2015 | Yamada |
| 2015/0221816 A1 | 8/2015 | Tajikara et al. |
| 2015/0298252 A1 | 10/2015 | Kawaguchi |
| 2016/0016257 A1 | 1/2016 | Hosseini |
| 2016/0039044 A1 | 2/2016 | Kawaguchi |
| 2016/0045979 A1 | 2/2016 | Kawaguchi et al. |
| 2016/0052083 A1 | 2/2016 | Kawaguchi et al. |
| 2016/0052084 A1 | 2/2016 | Kawaguchi et al. |
| 2016/0052085 A1 | 2/2016 | Kawaguchi et al. |
| 2016/0052088 A1 | 2/2016 | Kawaguchi et al. |
| 2016/0052090 A1 | 2/2016 | Tanigawa |
| 2016/0074960 A1 | 3/2016 | Hirata et al. |
| 2016/0158881 A1 | 6/2016 | Hirata et al. |
| 2016/0158882 A1 | 6/2016 | Hirata et al. |
| 2016/0158892 A1 | 6/2016 | Hirata et al. |
| 2016/0189954 A1 | 6/2016 | Kong et al. |
| 2016/0193690 A1 | 7/2016 | Hirata et al. |
| 2016/0193691 A1 | 7/2016 | Hirata et al. |
| 2016/0197698 A1 | 7/2016 | Oxenlowe et al. |
| 2016/0228983 A1 | 8/2016 | Hirata et al. |
| 2016/0228984 A1 | 8/2016 | Hirata et al. |
| 2016/0228985 A1 | 8/2016 | Hirata et al. |
| 2016/0288250 A1 | 10/2016 | Hirata et al. |
| 2016/0288251 A1 | 10/2016 | Hirata et al. |
| 2016/0293397 A1 | 10/2016 | Hirata et al. |
| 2016/0305042 A1 | 10/2016 | Hirata |
| 2016/0307763 A1 | 10/2016 | Hirata |
| 2016/0354862 A1 | 12/2016 | Hirata |
| 2016/0354863 A1 | 12/2016 | Hirata |
| 2017/0014944 A1 | 1/2017 | Hirata et al. |
| 2017/0015017 A1 | 1/2017 | Hirata |
| 2017/0025275 A1 | 1/2017 | Hirata et al. |
| 2017/0025276 A1 | 1/2017 | Hirata |
| 2017/0053829 A1 | 2/2017 | Hirata et al. |
| 2017/0053831 A1 | 2/2017 | Hirata et al. |
| 2017/0106476 A1 | 4/2017 | Sakamoto et al. |

(56) References Cited

U.S. PATENT DOCUMENTS

| | | |
|---|---|---|
| 2017/0113301 A1 | 4/2017 | Sakamoto et al. |
| 2017/0136572 A1 | 5/2017 | Hirata |
| 2017/0151627 A1 | 6/2017 | Hirata |
| 2017/0198411 A1 | 7/2017 | Hirata |
| 2017/0216973 A1 | 8/2017 | Sakamoto et al. |
| 2017/0250113 A1 | 8/2017 | Vanagas et al. |
| 2017/0291255 A1 | 10/2017 | Hirata |
| 2017/0301540 A1 | 10/2017 | Hashimoto et al. |
| 2017/0330800 A1 | 11/2017 | Beyer et al. |
| 2018/0043468 A1 | 2/2018 | Hirata |
| 2018/0056440 A1 | 3/2018 | Yamamoto et al. |
| 2018/0085851 A1 | 3/2018 | Hirata |
| 2018/0108568 A1 | 4/2018 | Wang et al. |
| 2018/0126484 A1 | 5/2018 | Richter et al. |
| 2018/0133834 A1 | 5/2018 | Beyer |
| 2018/0154543 A1 | 6/2018 | Hirata |
| 2018/0187332 A1 | 7/2018 | Powell et al. |
| 2018/0214976 A1 | 8/2018 | Iizuka et al. |
| 2018/0218896 A1 | 8/2018 | Hirata |
| 2018/0229331 A1 | 8/2018 | Hirata et al. |
| 2018/0243944 A1 | 8/2018 | Schilling et al. |
| 2018/0254223 A1 | 9/2018 | Hirata et al. |
| 2018/0290232 A1 | 10/2018 | Richter et al. |
| 2018/0308679 A1 | 10/2018 | Hirata |
| 2018/0315657 A1 | 11/2018 | Ikeno et al. |
| 2018/0354067 A1 | 12/2018 | Iizuka et al. |
| 2019/0001433 A1 | 1/2019 | Yamamoto |
| 2019/0006212 A1 | 1/2019 | Iizuka et al. |
| 2019/0019729 A1 | 1/2019 | Lichtensteiger et al. |
| 2019/0096746 A1 | 3/2019 | Drescher et al. |
| 2019/0148164 A1 | 5/2019 | Hirata et al. |
| 2019/0152019 A1 | 5/2019 | Hirata et al. |
| 2019/0160708 A1 | 5/2019 | Hinohara et al. |
| 2019/0160804 A1 | 5/2019 | Hinohara et al. |
| 2019/0181024 A1 | 6/2019 | Iizuka et al. |
| 2019/0221436 A1 | 7/2019 | Hirata |
| 2019/0304769 A1 | 10/2019 | Hirata et al. |
| 2019/0304800 A1 | 10/2019 | Yamamoto |
| 2020/0343139 A1 | 10/2020 | Wei |
| 2020/0388538 A1* | 12/2020 | Swoboda ............ B23K 26/0624 |

FOREIGN PATENT DOCUMENTS

| | | |
|---|---|---|
| CN | 102947493 A | 2/2013 |
| CN | 106346148 A | 1/2017 |
| CN | 107107260 A | 8/2017 |
| CN | 107170668 A | 9/2017 |
| CN | 107438581 A | 12/2017 |
| CN | 108372434 A | 8/2018 |
| CN | 107454892 A | 8/2021 |
| EP | 1609558 A1 | 12/2005 |
| EP | 1707298 A1 | 10/2006 |
| EP | 2578349 A1 | 4/2013 |
| EP | 2230040 B1 | 5/2015 |
| EP | 2223770 B1 | 6/2015 |
| JP | S59152581 A | 8/1984 |
| JP | H02179708 A | 7/1990 |
| JP | H04116848 A | 4/1992 |
| JP | 3408805 B2 | 5/2003 |
| JP | 3624909 B2 | 3/2005 |
| JP | 3626442 B2 | 3/2005 |
| JP | 3670267 B2 | 7/2005 |
| JP | 3751970 B2 | 3/2006 |
| JP | 3761565 B2 | 3/2006 |
| JP | 3761566 B2 | 3/2006 |
| JP | 3761567 B2 | 3/2006 |
| JP | 3822626 B2 | 9/2006 |
| JP | 3867003 B2 | 1/2007 |
| JP | 3867100 B2 | 1/2007 |
| JP | 3867101 B2 | 1/2007 |
| JP | 3867102 B2 | 1/2007 |
| JP | 3867103 B2 | 1/2007 |
| JP | 3867104 B2 | 1/2007 |
| JP | 3867105 B2 | 1/2007 |
| JP | 3867107 B2 | 1/2007 |
| JP | 3867108 B2 | 1/2007 |
| JP | 3867109 B2 | 1/2007 |
| JP | 3867110 B2 | 1/2007 |
| JP | 3869850 B2 | 1/2007 |
| JP | 3935186 B2 | 6/2007 |
| JP | 3935187 B2 | 6/2007 |
| JP | 3935188 B2 | 6/2007 |
| JP | 3935189 B2 | 6/2007 |
| JP | 3990710 B2 | 10/2007 |
| JP | 3990711 B2 | 10/2007 |
| JP | 4050534 B2 | 2/2008 |
| JP | 4095092 B2 | 6/2008 |
| JP | 4128204 B2 | 7/2008 |
| JP | 4142694 B2 | 9/2008 |
| JP | 4146863 B2 | 9/2008 |
| JP | 4167094 B2 | 10/2008 |
| JP | 4358502 B2 | 11/2009 |
| JP | 4409840 B2 | 2/2010 |
| JP | 4440582 B2 | 3/2010 |
| JP | 4463796 B2 | 5/2010 |
| JP | 4509573 B2 | 7/2010 |
| JP | 4509719 B2 | 7/2010 |
| JP | 4509720 B2 | 7/2010 |
| JP | 4527098 B2 | 8/2010 |
| JP | 2010205900 A | 9/2010 |
| JP | 4584607 B2 | 11/2010 |
| JP | 4659301 B2 | 3/2011 |
| JP | 4663952 B2 | 4/2011 |
| JP | 4664140 B2 | 4/2011 |
| JP | 4703983 B2 | 6/2011 |
| JP | 4732063 B2 | 7/2011 |
| JP | 4762458 B2 | 8/2011 |
| JP | 4837320 B2 | 12/2011 |
| JP | 4851060 B2 | 1/2012 |
| JP | 4964376 B2 | 6/2012 |
| JP | 5025876 B2 | 9/2012 |
| JP | 5037082 B2 | 9/2012 |
| JP | 5094337 B2 | 12/2012 |
| JP | 5094994 B2 | 12/2012 |
| JP | 5117806 B2 | 1/2013 |
| JP | 5122161 B2 | 1/2013 |
| JP | 5148575 B2 | 2/2013 |
| JP | 5177992 B2 | 4/2013 |
| JP | 2013124206 A | 6/2013 |
| JP | 2013126682 A | 6/2013 |
| JP | 5255109 B2 | 8/2013 |
| JP | 5269356 B2 | 8/2013 |
| JP | 2013154604 A | 8/2013 |
| JP | 2013157450 A | 8/2013 |
| JP | 2013157451 A | 8/2013 |
| JP | 2013157454 A | 8/2013 |
| JP | 2013157545 A | 8/2013 |
| JP | 5312761 B2 | 10/2013 |
| JP | 5322418 B2 | 10/2013 |
| JP | 5451238 B2 | 3/2014 |
| JP | 5468627 B2 | 4/2014 |
| JP | 2014156687 A | 8/2014 |
| JP | 2014156688 A | 8/2014 |
| JP | 2014156689 A | 8/2014 |
| JP | 2014156690 A | 8/2014 |
| JP | 2014156692 A | 8/2014 |
| JP | 5597051 B2 | 10/2014 |
| JP | 5597052 B2 | 10/2014 |
| JP | 5620553 B2 | 11/2014 |
| JP | 5670764 B2 | 2/2015 |
| JP | 5670765 B2 | 2/2015 |
| JP | 2015020187 A | 2/2015 |
| JP | 5771391 B2 | 8/2015 |
| JP | 5775312 B2 | 9/2015 |
| JP | 2015199071 A | 11/2015 |
| JP | 5844089 B2 | 1/2016 |
| JP | 5863891 B2 | 1/2016 |
| JP | 5864988 B2 | 2/2016 |
| JP | 5894754 B2 | 3/2016 |
| JP | 2016032828 A | 3/2016 |
| JP | 5905274 B2 | 4/2016 |
| JP | 5917862 B2 | 5/2016 |
| JP | 2016111150 A | 6/2016 |
| JP | 2017057103 A | 3/2017 |

(56) References Cited

FOREIGN PATENT DOCUMENTS

| | | | |
|---|---|---|---|
| JP | 2017189870 A | 10/2017 | |
| JP | 2017220631 A | 12/2017 | |
| JP | 6355540 B2 | 7/2018 | |
| JP | 2018-133484 A | 8/2018 | |
| JP | 6366485 B2 | 8/2018 | |
| JP | 6366486 B2 | 8/2018 | |
| JP | 2018147928 A | 9/2018 | |
| JP | 6418927 B2 | 11/2018 | |
| JP | 6444207 B2 | 12/2018 | |
| JP | 6494457 B2 | 4/2019 | |
| JP | 2019102676 A | 6/2019 | |
| JP | 2019161037 A | 9/2019 | |
| JP | 2020021878 A | 2/2020 | |
| JP | 2020027895 A | 2/2020 | |
| JP | 2020031134 A | 2/2020 | |
| JP | 2020035821 A | 3/2020 | |
| JP | 2020035873 A | 3/2020 | |
| JP | 2020047619 A | 3/2020 | |
| JP | 2020072098 A | 5/2020 | |
| JP | 2020077783 A | 5/2020 | |
| JP | 2020088097 A | 6/2020 | |
| JP | 2020092212 A | 6/2020 | |
| JP | 2021020242 A | 2/2021 | |
| KR | 100766727 B1 | 10/2007 | |
| KR | 101073183 B1 | 10/2011 | |
| KR | 101212875 B1 | 12/2012 | |
| KR | 101282459 B1 | 7/2013 | |
| KR | 101341675 B1 | 12/2013 | |
| KR | 101408491 B1 | 6/2014 | |
| KR | 20150021507 A | 3/2015 | |
| TW | 201243926 A | 11/2012 | |
| TW | 201334902 A | 9/2013 | |
| WO | 0032348 A1 | 6/2000 | |
| WO | 0032349 A1 | 6/2000 | |
| WO | WO 2018192689 | 10/2018 | |

OTHER PUBLICATIONS

Author Unknown, "BrewerBOND®220 Temporary Wafer Bonding Material," Aug. 27, 2014, Brewer Science, Inc., 1 page.
Non-Final Office Action for U.S. Appl. No. 16/274,045, dated Jun. 11, 2019, 31 pages.
Author Unknown, "Application Bulletin: Low-Temperature Performance of Silicone Elastomers," Electronics Solutions, 2003, Dow Corning Corporation, 8 pages.
Author Unknown, "Ceramics for Temperature," San Jose Delta, Inc. 2017, 3 pages.
Author Unknown, "Chapter 2: Thermal Expansion," ASM Ready Reference: Thermal Properties of Metals, 2002, ASM International, pp. 9-16.
Author Unknown, "Disco develops laser ingot slicing method to speed SiC wafer production and cut material loss," Semiconductor Today, Aug. 11, 2016, Juno Publishing and Media Solutions Ltd., 3 pages.
Author Unknown, "Disco's KABRA!zen fully automates KABRA laser slicing technology," Semiconductor Today, Dec. 11, 2017, Juno Publishing and Media Solutions Ltd., 3 pages.
Author Unknown, "Formation of Silicon and Gallium Arsenide Wafers," OpenStax CNX, accessed Dec. 17, 2018, Rice University, 15 pages.
Author Unknown, "IFTLE 171 Semicon Taiwan Part 3: Disco, Namies, Amkor," Insights from the Leading Edge Blog, Semiconductor Manufacturing & Design Community, accessed Dec. 17, 2018, 16 pages.
Author Unknown, "Supplementary Material (ESI) for Lab on a Chip," The Royal Society of Chemistry, 2007, 9 pages.
Author Unknown, "Technical Information: Stealth Dicing Technology and Applications," Hamamatsu, Mar. 2005, Hamamatsu Photonics K.K, 8 pages.
Author Uknown, "Tg—Glass Transition Temperature for Epoxies," Tech Tip 23, 2012, Epoxy Technology Inc., 2 pages.
Bedell, S.W. et al., "Fast Track Communication: Layer transfer by controlled spalling," Journal of Physics D: Applied Physics, vol. 46, Mar. 21, 2013, IOP Publishing Ltd., 7 pages.
Cao, B. et al., "In-Situ Real-Time Focus Detection during Laser Processing Using Double-Hole Masks and Advanced Image Sensor Software," Sensors, vol. 17, No. 7, Jul. 2017, MDPI, 13 pages.
Cree, "Cree Silicon Carbide Substrates and Epitaxy," Materials Catalogue, 1998-2013, Cree, Inc., 17 pages.
De Guire, M., "Introduction to Crystallography," Introduction to Materials Science & Engineering, 2006, p. 4.1-1.15.
Dunn, T. et al., "Metrology for Characterization of Wafer Thickness Uniformity During 3D-IC Processing," Corning Incorporated, retrieved May 9, 2019 from https://www.corning.com/media/worldwide/global/documents/semi%20Metrology%20for%20Characterization%20of%20Wafer%20Thickness%20Uniformity%20During%203D-IC%20Processing.pdf, 6 pages.
Friedmann, T. et al., "Laser Watering for Silicon Solar," Sandia Report SAND2011-2057, Jan. 2011, Sandia National Laboratories, 23 pages.
Happich, J., "Twinning rather than thinning: yields 100μm-thin wafers in minutes: p. 2 of 2," eeNews Europe, Feb. 27, 2018, European Business Press SA, 1 page.
Kim, M. et al., "4H-SiC wafer slicing by using femtosecond laser double-pulses," Optical Materials Express, vol. 7, No. 7, Jul. 1, 2017, Optical Society of America, 11 pages.
Kim, M. et al., "Enhancement of the thermo-mechanical properties of PDMS molds for the hot embossing of PMMA microfluidic devices," Journal of Micromechanics and Microengineering, vol. 23, Aug. 28, 2013, IOP Publishing Ltd, 12 pages.
Nezu, T., "Laser Facilitates Production of SiC Wafers," XTECH, Aug. 18, 2016, Nikkei Business Publications, Inc., 4 pages.
Richter, J. et al., "Cold Split Provides Significant Cost Advantages for SiC Substrates and Devices," Bodo's Power Systems: SiC Power Modules For a wide range of applications, Sep. 2017, 3 pages.
Wijesundara, M. et al., "Chapter 2: SiC Materials and Processing Technology," Silicon Carbide Microsystems for Harsh Environments, 2011, Springer, 64 pages.
Author Unknown, "What is Kabra®?" Disco Corporation, accessed Sep. 23, 2019 from http://www.discousa.com/kabra/index_eg.html#kabra_process, 7 pages.
Notice of Allowance for U.S. Appl. No. 16/274,064, dated Jul. 25, 2019, 14 pages.
Notice of Allowance for U.S. Appl. No. 16/410,487, dated Oct. 3, 2019, 9 pages.
Hirata, K., "New laser slicing technology named KABRA process enables high speed and high efficiency SiC slicing," Proceedings of SPIE, vol. 10520, Feb. 19, 2018, pp. 1052003-1-1052003-6.
Final Office Action for U.S. Appl. No. 16/274,045, dated Nov. 19, 2019, 38 pages.
Advisory Action and AFCP 2.0 Decision for U.S. Appl. No. 16/274,045, dated Jan. 7, 2020, 4 pages.
Non-Final Office Action for U.S. Appl. No. 16/274,045, dated Apr. 6, 2020, 38 pages.
Notice of Allowance for U.S. Appl. No. 16/274,064, dated Nov. 4, 2019, 12 pages.
Notice of Allowance for U.S. Appl. No. 16/415,721, dated Nov. 15, 2019, 10 pages.
Corrected Notice of Allowability for U.S. Appl. No. 16/415,721, dated Mar. 4, 2020, 4 pages.
International Preliminary Report on Patentability for International Patent Application No. PCT/IB2019/061410, dated Jul. 8, 2021, 15 pages.
International Preliminary Report on Patentability for International Patent Application No. PCT/IB2019/061412, dated Jul. 8, 2021, 13 pages.
Corrected Notice of Allowability for U.S. Appl. No. 16/784,311, dated May 19, 2021, 4 pages.
International Preliminary Report on Patentability for International Patent Application No. PCT/IB2019/061409, dated Jul. 8, 2021, 9 pages.

(56) References Cited

OTHER PUBLICATIONS

Invitation to Pay Additional Fees and Partial Search for International Patent Application No. PCT/IB2019/061412, dated Jun. 17, 2020, 11 pages.
International Search Report and Written Opinion for International Patent Application No. PCT/IB2019/061412, dated Aug. 7, 2020, 21 pages.
International Search Report and Written Opinion for International Patent Application No. PCT/US2020/022626, dated Jul. 8, 2020, 17 pages.
Final Office Action for U.S. Appl. No. 16/274,045, dated Aug. 3, 2020, 37 pages.
Non-Final Office Action for U.S. Appl. No. 16/784,311, dated Aug. 20, 2020, 5 pages.
International Search Report and Written Opinion for International Patent Application No. PCT/IB2019/061410, dated Oct. 5, 2020, 24 pages.
Advisory Action for U.S. Appl. No. 16/274,045, dated Oct. 9, 2020, 4 pages.
Notice of Allowance for U.S. Appl. No. 16/274,045, dated Jan. 28, 2021, 10 pages.
Corrected Notice of Allowability for U.S. Appl. No. 16/274,045, dated Feb. 16, 2021, 5 pages.
Notice of Allowance for U.S. Appl. No. 16/784,311, dated Oct. 21, 2020, 8 pages.
Notice of Allowance for U.S. Appl. No. 16/784,311, dated Feb. 18, 2021, 8 pages.
Non-Final Office Action for U.S. Appl. No. 16/792,261, dated Apr. 15, 2021, 7 pages.
Amendment Accompanying Request for Continued Examination, Petition to Withdraw from Issue, and Statement of Applicant Admitted Prior Art for U.S. Appl. No. 16/784,311, submitted Feb. 4, 2021, 7 pages.
Notice of Allowance for U.S. Appl. No. 16/792,261, dated Sep. 2, 2021, 10 pages.
First Office Action for Chinese Patent Application No. 2019800871978, dated Feb. 9, 2022, 10 pages.
Examination Report for Indian Patent Application No. 202117055610, dated Jun. 9, 2022, 7 pages.
First Office Action for Chinese Patent Application No. 2019800932581, dated Jun. 13, 2022, 16 pages.
Final Office Action for U.S. Appl. No. 16/274,045, dated Jun. 11, 2019, 30 pages.
International Search Report and Written Opinion for International Patent Application No. PCT/IB2019/061409, dated Apr. 20, 2020, 17 pages.
Invitation to Pay Additional Fees and Partial Search for International Patent Application No. PCT/IB2019/061410, dated Jun. 9, 2020, 11 pages.
Notice of Allowance for U.S. Appl. No. 16/274,064, dated Jun. 6, 2019, 12 pages.
Second Office Action with Machine Translation for Chinese Patent Application No. 2019800871978, dated Jul. 20, 2022, 22 pages.
Japanese Office Action with Machine Translation for Application No. 2022-515614 dated Jan. 13, 2023, 14 pages.
First Office Action with Machine Translation for Japanese Patent Application No. 2021-538067, dated Jan. 24, 2023, 9 pages/
First Office Action with Machine Translation for Japanese Patent Application No. 2021-538091, dated Jan. 24, 2023, 6 pages.
First Office Action with Machine Translation for Korean Patent Application No. 10-2021-7024093, dated Feb. 7, 2023, 11 pages.
First Office Action with Machine Translation for Korean Patent Application No. 10-2021-7024073, dated Feb. 7, 2023, 9 pages.

\* cited by examiner

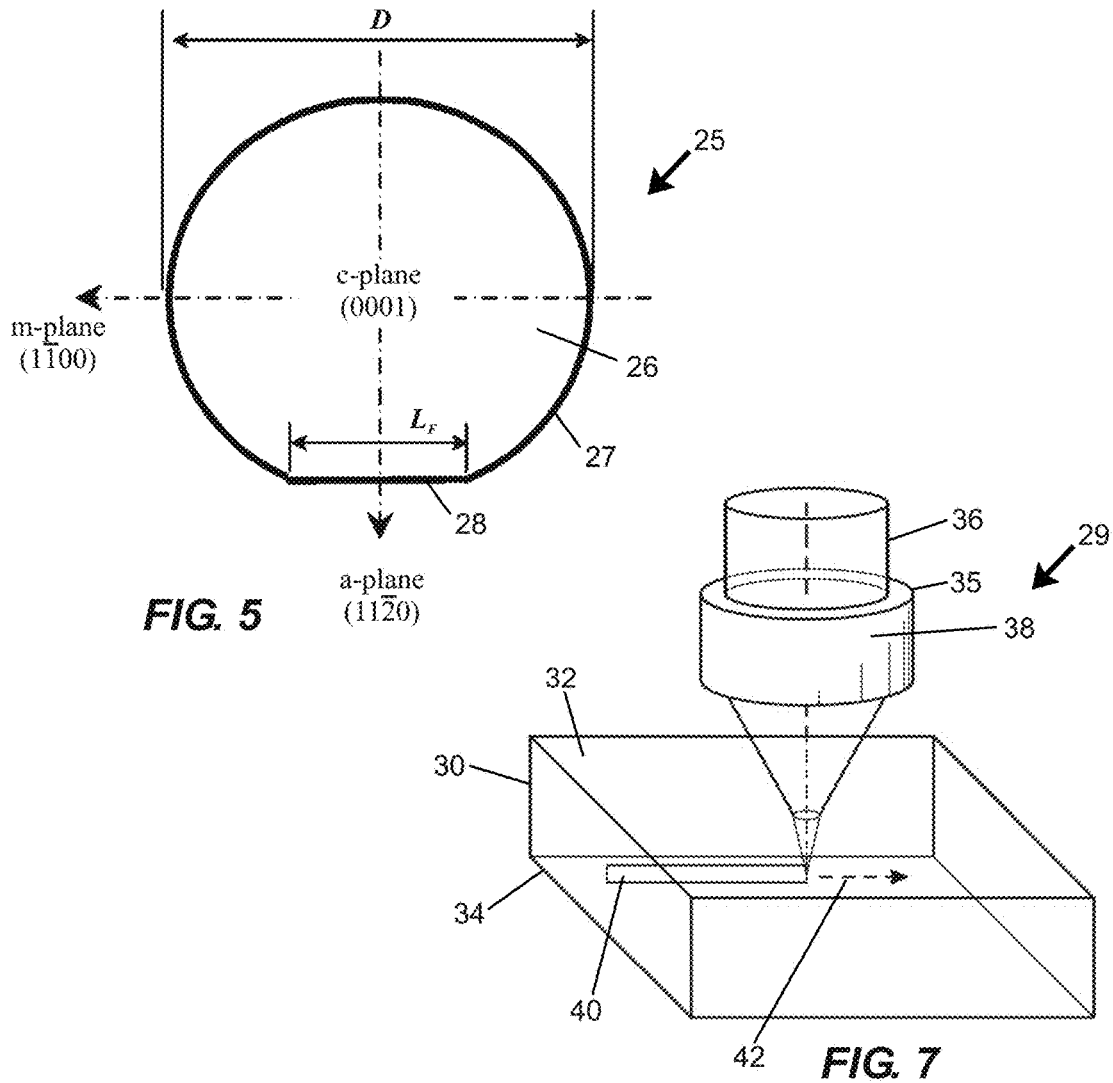
FIG. 5
FIG. 7
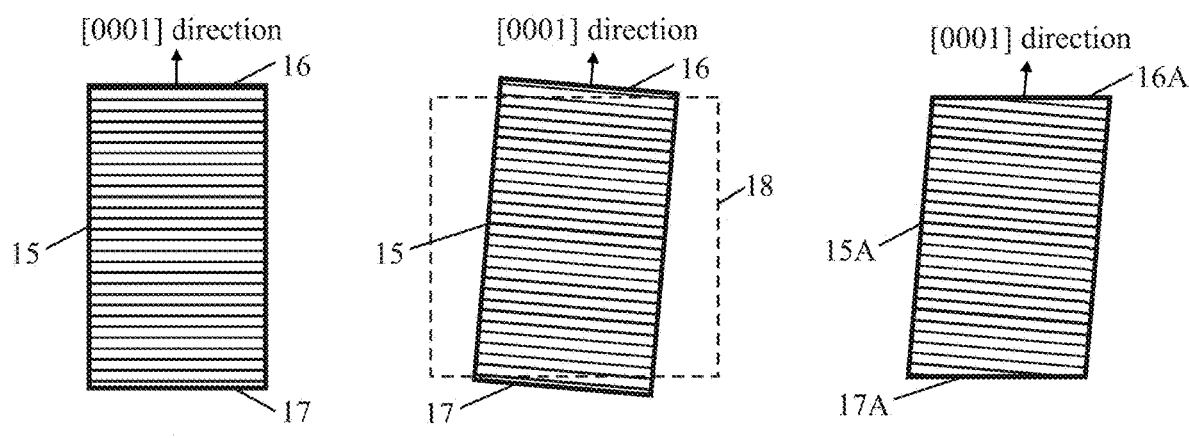
FIG. 6A   FIG. 6B   FIG. 6C

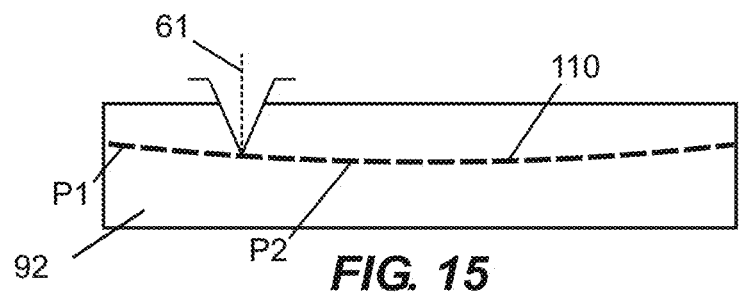
FIG. 15
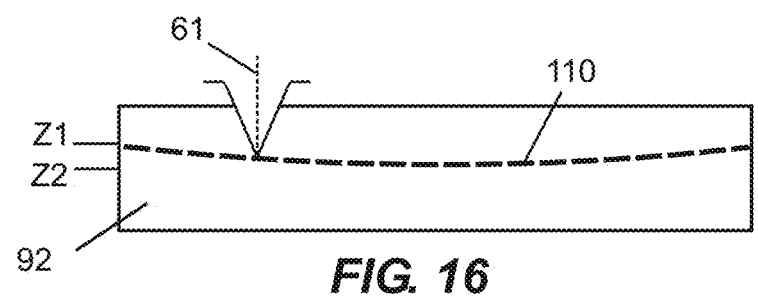
FIG. 16
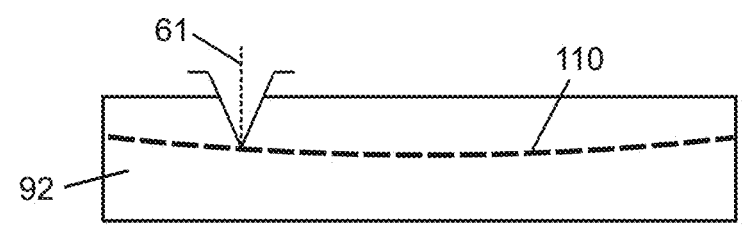
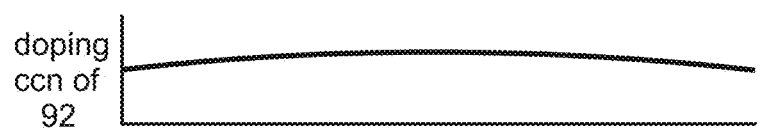
FIG. 17

SILICON CARBIDE WAFERS WITH RELAXED POSITIVE BOW AND RELATED METHODS

RELATED APPLICATIONS

This application is a continuation of patent application Ser. No. 16/784,311, filed on Feb. 7, 2020, now U.S. Pat. No. 11,034,056, which is a continuation of patent application Ser. No. 16/415,721, filed on May 17, 2019, now U.S. Pat. No. 10,611,052, the disclosures of which are hereby incorporated herein by reference in their entireties.

FIELD OF THE DISCLOSURE

The present disclosure relates to methods for processing crystalline materials, and more specifically to methods for forming wafers from bulk crystalline material.

BACKGROUND

Various microelectronic, optoelectronic, and microfabrication applications require thin layers of crystalline materials as a starting structure for fabricating various useful systems. Traditional methods for cutting thin layers (e.g., wafers) from large diameter crystalline ingots of crystalline materials have involved use of wire saws. Wire sawing technology has been applied to various crystalline materials, such as silicon (Si), sapphire, and silicon carbide (SiC). A wire saw tool includes an ultra-fine steel wire (typically having a diameter of 0.2 mm or less) that is passed through grooves of one or many guide rollers. Two slicing methods exist, namely, loose abrasive slicing and fixed abrasive slicing. Loose abrasive slicing involves application of a slurry (typically a suspension of abrasives in oil) to a steel wire running at high speed, whereby the rolling motion of abrasives between the wire and the workpiece results in cutting of an ingot. Unfortunately, the environmental impact of slurry is considerable. To reduce such impact, a wire fixed with diamond abrasives may be used in a fixed abrasive slicing method that requires only a water-soluble coolant liquid (not a slurry). High-efficiency parallel slicing permits a large number of wafers to be produced in a single slicing procedure. FIG. 1 illustrates a conventional wire saw tool 1 including parallel wire sections 3 extending between rollers 4A-4C and arranged to simultaneously saw an ingot 2 into multiple thin sections (e.g., wafers 8A-8G) each having a face generally parallel to an end face 6 of the ingot 2. During the sawing process, the wire sections 3 supported by the rollers 4A-4C may be pressed in a downward direction 5 toward a holder 7 underlying the ingot 2. If the end face 6 is parallel to a crystallographic c-plane of the ingot 2, and the wire sections 3 saw through the ingot 2 parallel to the end face 6, then each resulting wafer 8A-8G will have an "on-axis" end face 6' that is parallel to the crystallographic c-plane.

It is also possible to produce vicinal (also known as offcut or "off-axis") wafers having end faces that are not parallel to the crystallographic c-plane. Vicinal wafers (e.g., of SiC) having a 4 degree offcut are frequently employed as growth substrates for high-quality epitaxial growth of other materials (e.g., AlN and other Group III nitrides). Vicinal wafers may be produced either by growing an ingot in a direction away from the c-axis (e.g., growing over a vicinal seed material and sawing the ingot perpendicular to the ingot sidewalls), or by growing an ingot starting with an on-axis seed material and sawing the ingot at an angle that departs from perpendicular to the ingot sidewalls.

Wire sawing of semiconductor materials involves various limitations. Kerf losses based on the width of material removed per cut are inherent to saw cutting and represent a significant loss of semiconductor material. Wire saw cutting applies moderately high stress to wafers, resulting in non-zero bow and warp characteristics. Processing times for a single boule (or ingot) are very long, and events like wire breaks can increase processing times and lead to undesirable loss of material. Wafer strength may be reduced by chipping and cracking on the cut surface of a wafer. At the end of a wire sawing process, the resulting wafers must be cleaned of debris.

In the case of SiC having high wear resistance (and a hardness comparable to diamond and boron nitride), wire sawing may require significant time and resources, thereby entailing significant production costs. SiC substrates enable fabrication of desirable power electronic, radio frequency, and optoelectronic devices. SiC occurs in many different crystal structures called polytypes, with certain polytypes (e.g., 4H-SiC and 6H-SiC) having a hexagonal crystal structure.

FIG. 2 is a first perspective view crystal plane diagram showing the coordinate system for a hexagonal crystal such as 4H-SiC, in which the c-plane ((0001) plane), corresponding to a [0001] (vertical) direction of epitaxial crystal growth) is perpendicular to both the m-plane ((1$\overline{1}$00) plane) and the a-plane ((11$\overline{2}$0) plane), with the (1$\overline{1}$00) plane being perpendicular to the [1$\overline{1}$00] direction, and the (11$\overline{2}$0) plane being perpendicular to the [11$\overline{2}$0] direction. FIG. 3 is a second perspective view crystal plane diagram for a hexagonal crystal, illustrating a vicinal plane 9 that is non-parallel to the c-plane, wherein a vector 10 (which is normal to the vicinal plane 9) is tilted away from the [0001] direction by a tilt angle $\beta$, with the tilt angle $\beta$ being inclined (slightly) toward the [11$\overline{2}$0] direction.

FIG. 4A is a perspective view wafer orientation diagram showing orientation of a vicinal wafer 11A relative to the c-plane ((0001) plane), in which a vector 10A (which is normal to a wafer face 9A) is tilted away from the [0001] direction by a tilt angle $\beta$. This tilt angle $\beta$ is equal to an orthogonal tilt (or misorientation angle) $\beta$ that spans between the (0001) plane and a projection 12A of the wafer face 9A. FIG. 4B is a simplified cross-sectional view of the vicinal wafer 11A superimposed over a portion of an ingot 14A (e.g., an on-axis ingot having an end face 6A parallel to the (0001) plane) from which the vicinal wafer 11A was defined. FIG. 4B shows that the wafer face 9A of the vicinal wafer 11A is misaligned relative to the (0001) plane by the tilt angle $\beta$.

FIG. 5 is a top plan view of an exemplary SiC wafer 25 including an upper face 26 (e.g., that is parallel to the (0001) plane (c-plane), and perpendicular to the [0001] direction) and laterally bounded by a generally round edge 27 (having a diameter D) including a primary flat 28 (having a length $L_F$) that is perpendicular to the (11$\overline{2}$0) plane, and parallel to the [11$\overline{2}$0] direction. A SiC wafer may include an outer surface that is misaligned with (e.g., off-axis at an oblique angle relative to) the c-plane.

Due to difficulties associated with making and processing SiC, SiC device wafers have a high cost relative to wafers of various other semiconductor materials. Typical kerf losses obtained from wire sawing SiC are significantly high compared with a thickness of a resulting wafer, taking into account material loss during the sawing process and subsequently thinning, grinding, or polishing of the wafer after sawing. It has been impractical to slice wafers thinner than about 350 µm considering wire sawing and device fabrication issues.

To seek to address limitations associated with wire sawing, alternative techniques for removing thin layers of semiconductor materials from bulk crystals have been developed. One technique involving removal of a layer of silicon carbide from a larger crystal is described in Kim et al., "4H-SiC wafer slicing by using femtosecond laser double pulses," Optical Materials Express 2450, vol. 7, no. 7 (2017). Such technique involves formation of laser-written tracks by impingement of laser pulses on SiC to induce subsurface damage, followed by adhesion of the crystal to a locking jig and application of tensile force to effectuate fracture along a subsurface damage zone. Use of the laser to weaken specific areas in the material followed by fracture between those areas reduces the laser scanning time.

Another separation technique involving formation of laser subsurface damage is disclosed by U.S. Pat. No. 9,925,619 to Disco Corporation. Laser subsurface damage lines are formed by movement of a SiC ingot in a forward path, indexing the focal point of the laser, then moving the ingot in a backward path, indexing the focal point of the laser, and so on. The formation of laser subsurface damage produces internal cracks extending parallel to a c-plane within an ingot, and ultrasonic vibration is applied to the ingot to introduce fracture.

A similar separation technique involving formation of laser subsurface damage is disclosed by U.S. Pat. No. 10,155,323 to Disco Corporation. A pulsed laser beam is supplied to a SiC ingot to form multiple continuous modified portions each having a 17 µm diameter with an overlap rate of 80% in the feeding direction, and the focal point of the laser is indexed, with the modified portion forming step and indexing step being alternately performed to produce a separation layer in which cracks adjacent to each other in the indexing direction are connected. Thereafter, ultrasonic vibration is applied to the ingot to introduce fracture.

Another technique for removing thin layers of semiconductor materials from bulk crystals is disclosed in U.S. Patent Application Publication No. 2018/0126484A1 to Siltectra GmbH. Laser radiation is impinged on a solid state material to create a detachment zone or multiple partial detachment zones, followed by formation of a polymer receiving layer (e.g., PDMS) and cooling (optionally combined with high-speed rotation) to induce mechanical stresses that cause a thin layer of the solid state material to separate from a remainder of the material along the detachment zone(s).

Tools for forming laser subsurface damage in semiconductor materials are known in the art and commercially available from various providers, such as Disco Corporation (Tokyo, Japan). Such tools permit laser emissions to be focused within an interior of a crystalline substrate, and enable lateral movement of a laser relative to the substrate. Typical laser damage patterns include formation of parallel lines that are laterally spaced relative to one another at a depth within a crystalline material substrate. Parameters such as focusing depth, laser power, translation speed, etc. may be adjusted to impart laser damage, but adjustment of certain factors involves tradeoffs. Increasing laser power tends to impart greater subsurface damage that may increase ease of fracturing (e.g., by reducing the stress required to complete fracturing), but greater subsurface damage increases surface irregularities along surfaces exposed by fracturing, such that additional processing may be required to render such surfaces sufficiently smooth for subsequent processing (e.g., for incorporation in electronic devices). Reducing lateral spacing between subsurface laser damage lines may also increase ease of fracturing, but a reduction in spacing between laser damage lines increases the number of translational passes between a substrate and a laser, thereby reducing tool throughput. Additionally, results obtained by laser processing may vary within a substrate, depending on lateral or radial position at a particular vertical position, and/or depending on vertical position of a substrate face relative to its original growth position as part of an ingot.

Accordingly, the art continues to seek improved methods for parting or removing relatively thin layers of crystalline material from a substrate that address issues associated with conventional methods.

SUMMARY

Silicon carbide (SiC) wafers and related methods are disclosed that include intentional or imposed wafer shapes that are configured to reduce manufacturing problems associated with deformation, bowing, or sagging of such wafers due to gravitational forces or from preexisting crystal stress. In certain embodiments, the intentional or imposed wafer shapes may comprise SiC wafers with a relaxed positive bow from silicon faces thereof. In this manner, effects associated with deformation, bowing, or sagging for SiC wafers, and in particular for large area SiC wafers, may be reduced. In certain embodiments, methods for providing SiC wafers with relaxed positive bow are disclosed that provide reduced kerf losses of bulk crystalline material. Such methods may include laser-assisted separation of SiC wafers from bulk crystalline material.

In one aspect, a crystalline material processing method comprises: providing a bulk crystalline material comprising SiC; and separating a SiC wafer from the bulk crystalline material such that the SiC wafer forms a relaxed positive bow from a silicon face of the SiC wafer, and a kerf loss associated with forming the SiC wafer from the bulk crystalline material is less than 250 microns (µm). In certain embodiments, the kerf loss is less than 175 µm; or in a range including 100 µm to 250 µm. In certain embodiments, the relaxed positive bow is in a range from greater than 0 µm to 50 µm; or in a range from greater than 0 µm to 40 µm; or in a range from greater than 0 µm to 15 µm; or in a range including 30 µm to 50 µm; or in a range including 8 µm to 16 µm. In certain embodiments, the SiC wafer comprises a diameter to thickness ratio of at least 250; or at least 300; or at least 400; or in a range including 250 to 1020. In certain embodiments, the SiC wafer comprises an n-type conductive SiC wafer; or a semi-insulating SiC wafer; or an unintentionally doped SiC wafer. In certain embodiments, a carbon face of the SiC wafer comprises a shape that corresponds to the relaxed positive bow from the silicon face. In certain embodiments, a profile of the silicon face that is defined by the relaxed positive bow differs from a profile of a carbon face of the SiC wafer.

In another aspect, a crystalline material processing method comprises: providing a bulk crystalline material comprising silicon carbide (SiC); forming a subsurface laser damage pattern within the bulk crystalline material; separating a SiC wafer from the bulk crystalline material along the subsurface laser damage pattern such that the SiC wafer comprises a relaxed positive bow from a silicon face of the SiC wafer. In certain embodiments, the relaxed positive bow is in a range from greater than 0 µm to 50 µm; or in a range from greater than 0 µm to 15 µm; or in a range including 30 µm to 50 µm; or in a range including 8 µm to 16 µm. In certain embodiments, forming the subsurface laser damage pattern comprises variably adjusting a laser power across the bulk crystalline material to form a nonlinear profile of the subsurface laser damage pattern such that the relaxed positive bow is provided after separation. In certain embodiments, forming the subsurface laser damage pattern comprises variably adjusting a focal point of a laser across the bulk crystalline material to form a nonlinear profile of the subsurface laser damage pattern such that the relaxed positive bow is provided after separation. In certain embodiments, the bulk crystalline material is arranged with a radial doping profile such that laser absorption during said forming the subsurface laser damage pattern forms a nonlinear profile of the subsurface laser damage pattern such that the relaxed positive bow is provided after separation. In certain embodiments, the SiC wafer comprises a diameter to thickness ratio of at least 250; or at least 300; or at least 400; or in a range including 250 to 1020. In certain embodiments, a kerf loss associated with forming the SiC wafer from the bulk crystalline material is less than 250 microns ($\beta$m).

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 includes a first frame providing a perspective view of an ingot received by a conventional wire saw tool and being subjected to a wire sawing process, and a second frame providing a perspective view of multiple wafers obtained by the wire sawing process.

FIG. 5 is a top plan view of an exemplary SiC wafer, with superimposed arrows showing crystallographic orientation directions.

FIG. 6A is a side elevation schematic view of an on-axis ingot of crystalline material.

FIG. 6B is a side elevation schematic view of the ingot of FIG. 6A being rotated by 4 degrees, with a superimposed pattern for cutting end portions of the ingot.

FIG. 6C is a side elevation schematic view of an ingot following removal of end portions to provide end faces that are non-perpendicular to the c-direction.

FIG. 7 is a perspective view schematic of a moveable laser tool configured to focus laser emissions within an interior of a crystalline material to form subsurface damage.

Figure 1:
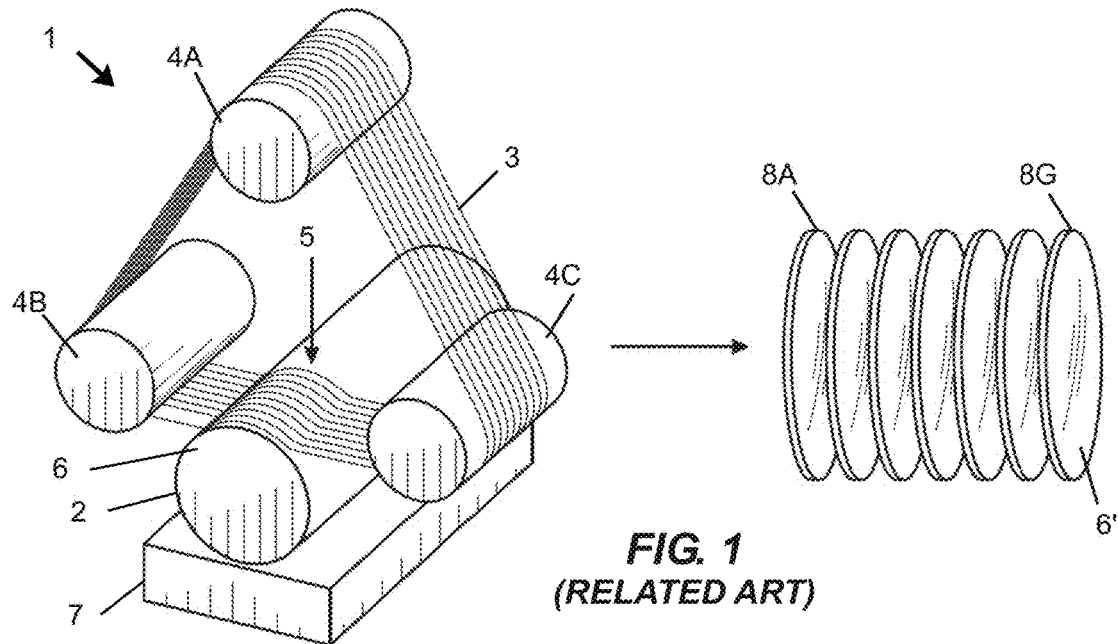
Figure 2:
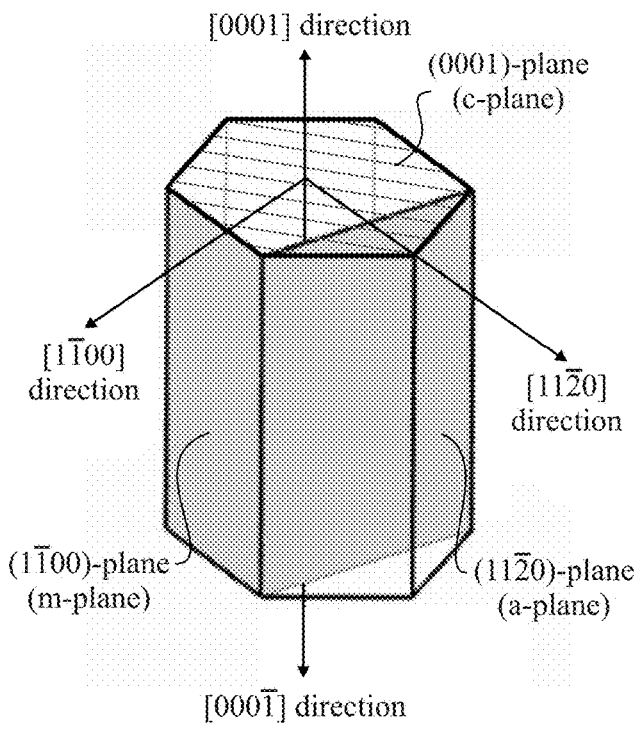
FIG. 2 is a first perspective view crystal plane diagram showing the coordinate system for a hexagonal crystal such as 4H silicon carbide (SiC).
Figure 3:
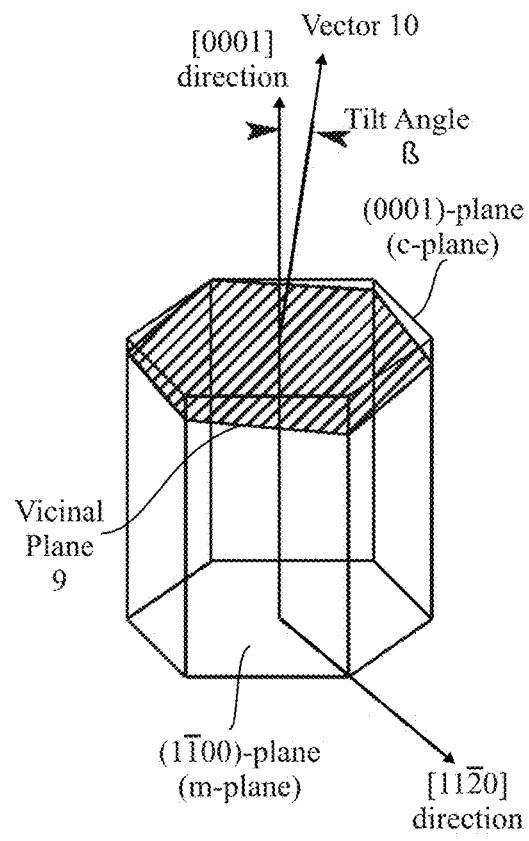
FIG. 3 is a second perspective view crystal plane diagram for a hexagonal crystal, illustrating a vicinal plane that is non-parallel to the c-plane.
Figure 4A:
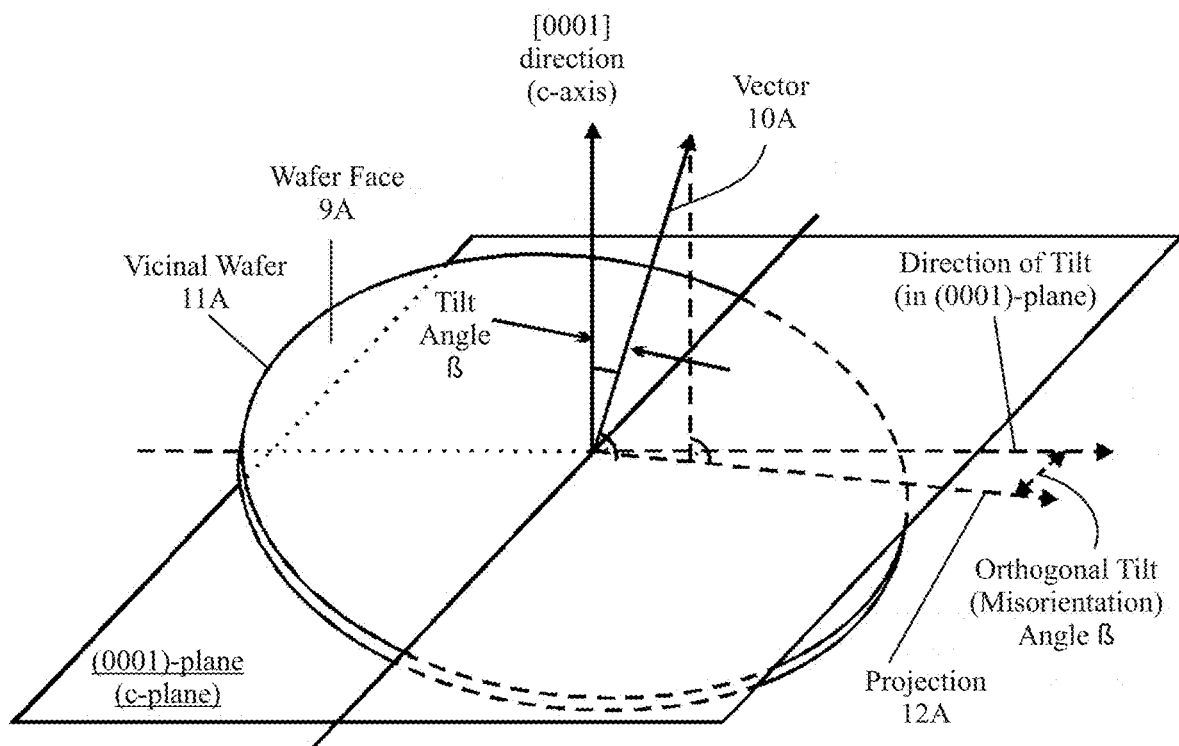
FIG. 4A is a perspective view wafer orientation diagram showing orientation of a vicinal wafer relative to the c-plane.
Figure 4B:
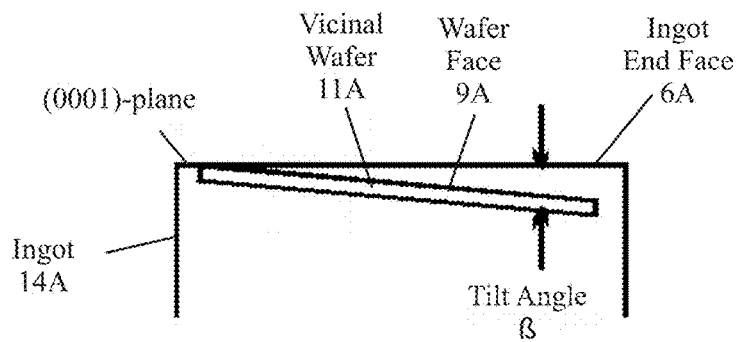
FIG. 4B is a simplified cross-sectional view of the vicinal wafer of FIG. 4A superimposed over a portion of an ingot.
Figure 8A:
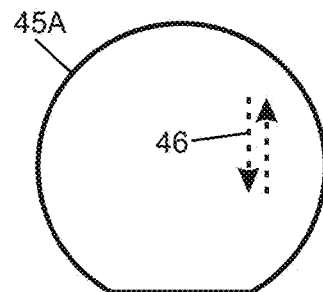
Figure 8B:
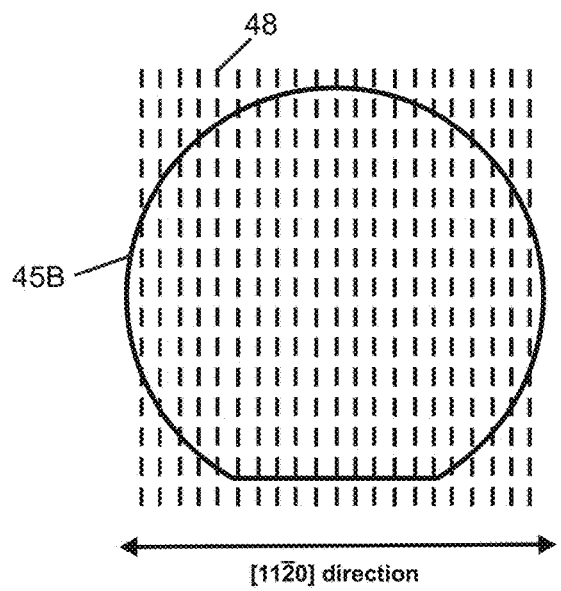

FIGS. 8A and 8B provide exemplary laser tool travel paths relative to a crystalline material for formation of subsurface damage within the crystalline material, with FIG. 8B including a superimposed arrow showing orientation of subsurface damage lines relative to the [11$\bar{2}$0] direction of a hexagonal crystal structure of the crystalline material.

Figure 9:
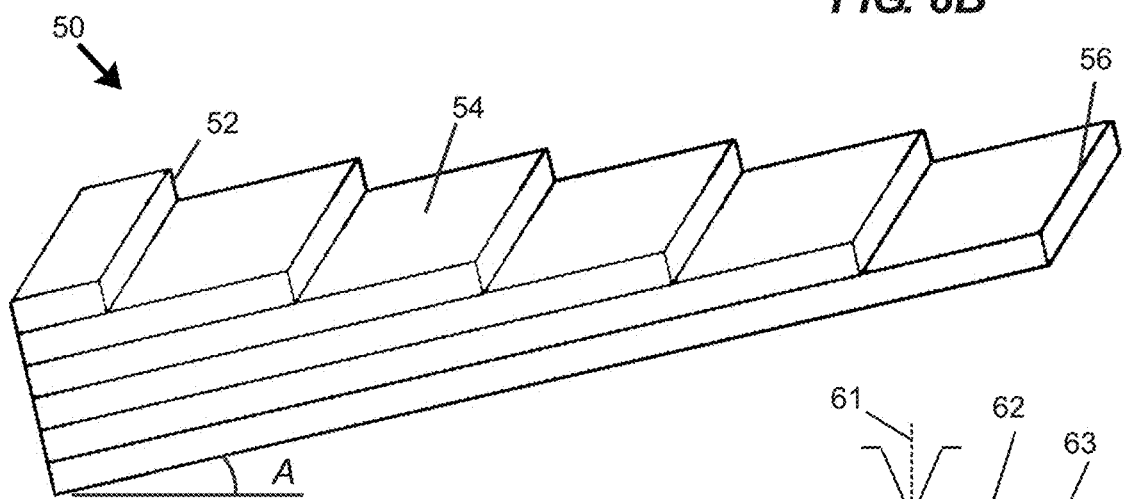

FIG. 9 is a perspective view schematic of the surface structure of an off-axis (relative to the c-axis) or vicinal 4H-SiC crystal after fracture but prior to smoothing, with the fractured surface exhibiting terraces and steps.

FIGS. 10A-10D are cross-sectional schematic views of formation of subsurface laser damage in a substrate of crystalline material by focusing laser emissions into a bare substrate, through a surface of a substrate supported by a carrier, through a carrier and an adhesive layer into a substrate, and through a carrier into a substrate, respectively.

Figure 11:
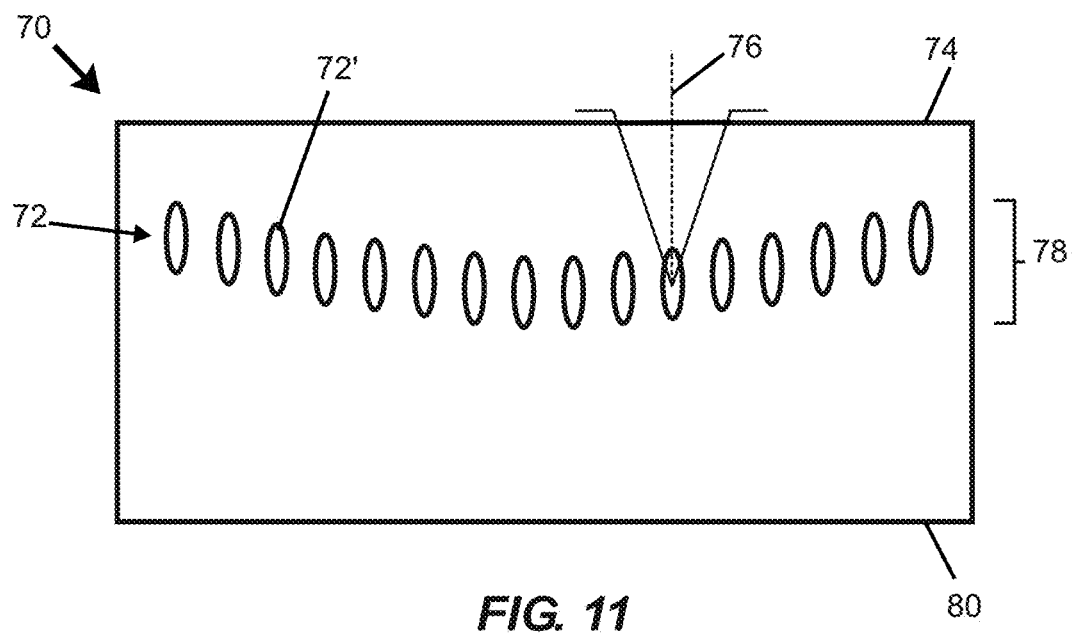

FIG. 11 is a cross-sectional schematic view of a bulk crystalline material including a first subsurface laser damage pattern formed therein.

Figure 12:
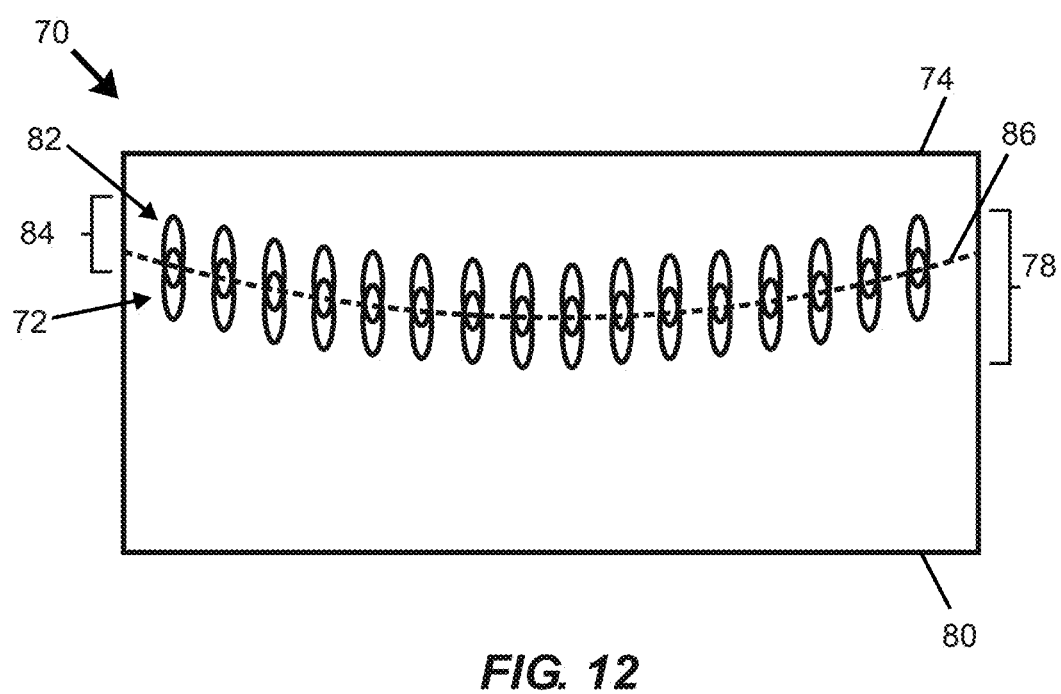

FIG. 12 is a cross-sectional schematic view of the bulk crystalline material of FIG. 11 following formation of a second subsurface laser damage pattern that is registered with the first subsurface laser damage pattern, with an overlapping vertical extent of the first and second subsurface laser damage patterns.

Figure 13:
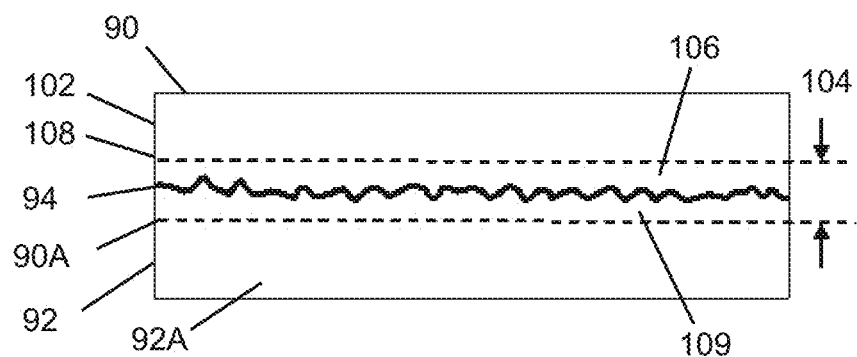

FIG. 13 is a cross-sectional schematic view of a portion of bulk crystalline material showing subsurface laser damage with superimposed dashed lines identifying an anticipated kerf loss material region.

Figure 14:
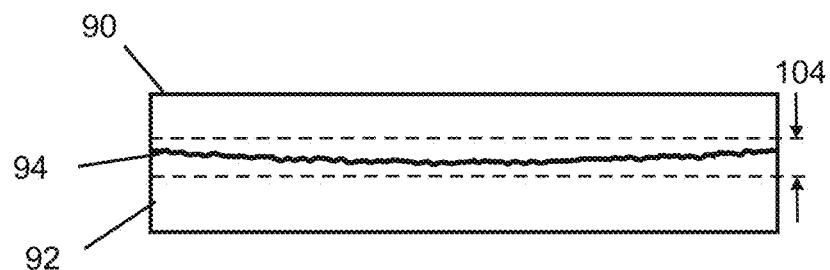

FIG. 14 is a cross-sectional schematic view of a portion of the bulk crystalline material showing curved subsurface laser damage with superimposed dashed lines identifying the anticipated kerf loss material region.

FIG. 15 is cross-sectional schematic view of laser emissions with variable laser power being focused across a portion of the bulk crystalline material to form the curved shape of subsurface laser damage.

FIG. 16 is cross-sectional schematic view of laser emissions with variable height adjustment being focused across a portion of the bulk crystalline material to form the curved shape of subsurface laser damage.

FIG. 17 is cross-sectional schematic view of laser emissions being focused across a variably doped portion of the bulk crystalline material to form the curved shape of subsurface laser damage.

Figure 18:
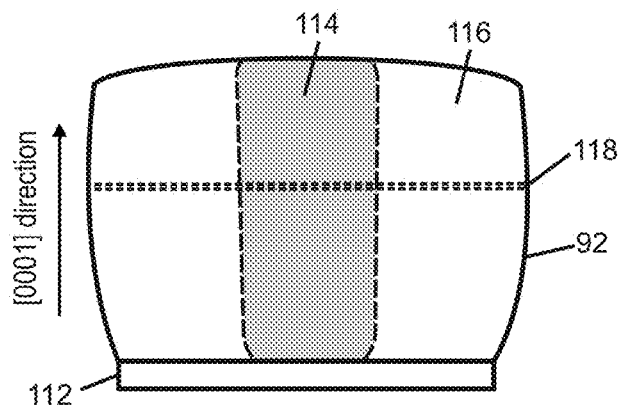

FIG. 18 is a side cross-sectional schematic view of bulk crystalline material of SiC on a seed crystal, showing a cylindrically shaped higher doping region extending upward from the seed crystal through the entire thickness of the bulk crystalline material along a central portion thereof.

Figure 19:
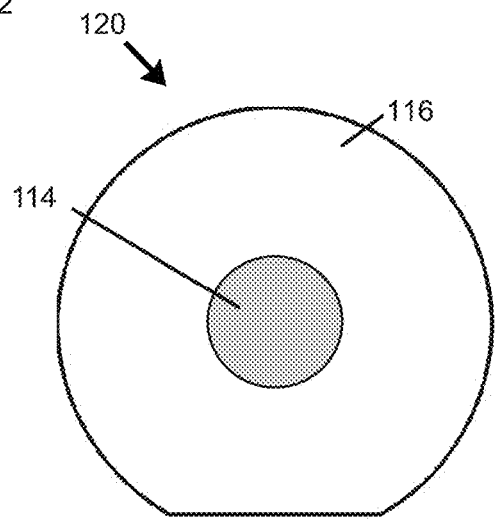

FIG. 19 is a top schematic view of a SiC wafer derived from the bulk crystalline material of FIG. 18 along a cross-sectional portion.

Figure 20:
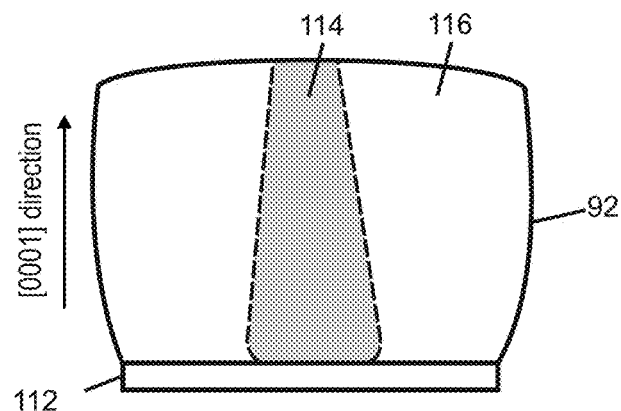

FIG. 20 is a side cross-sectional schematic view of bulk crystalline material of SiC on the seed crystal, showing a frustoconically shaped higher doping region extending upward from the seed crystal through the entire thickness of the bulk crystalline material along a central portion thereof.

Figure 21:
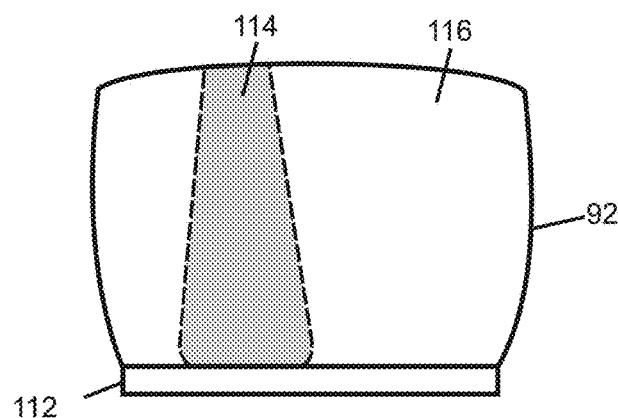

FIG. 21 is a side cross-sectional schematic view of bulk crystalline material of SiC on the seed crystal, showing a frustoconically shaped higher doping region extending upward from the seed crystal at a non-centered position relative to a center of the seed crystal and upward through the entire thickness of the bulk crystalline material.

Figure 22:
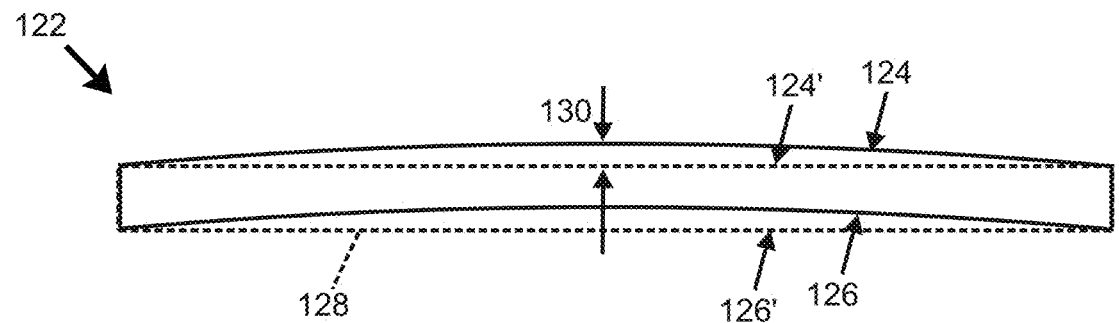

FIG. 22 is a side cross-sectional schematic view of a SiC wafer having a relaxed positive bow from a silicon face thereof and a corresponding shape of a carbon face according to embodiments disclosed herein.

Figure 23:
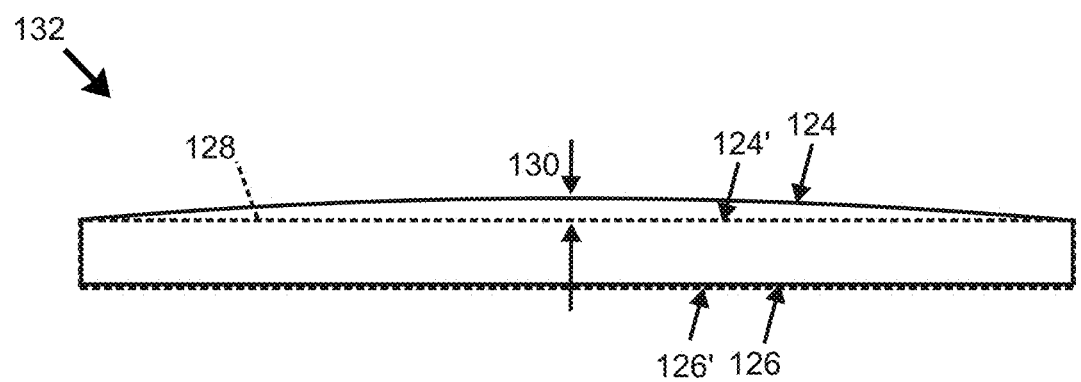

FIG. 23 is a side cross-sectional schematic view of a SiC wafer having a relaxed positive bow from a silicon face thereof and a generally planar carbon face according to embodiments disclosed herein.

Figure 24A:
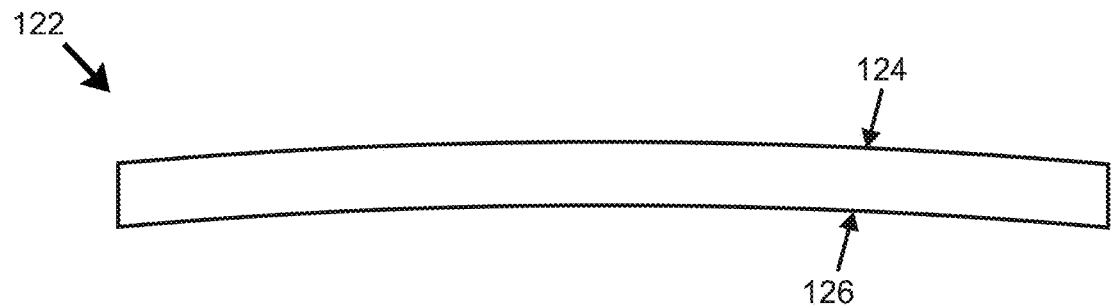
Figure 24B:
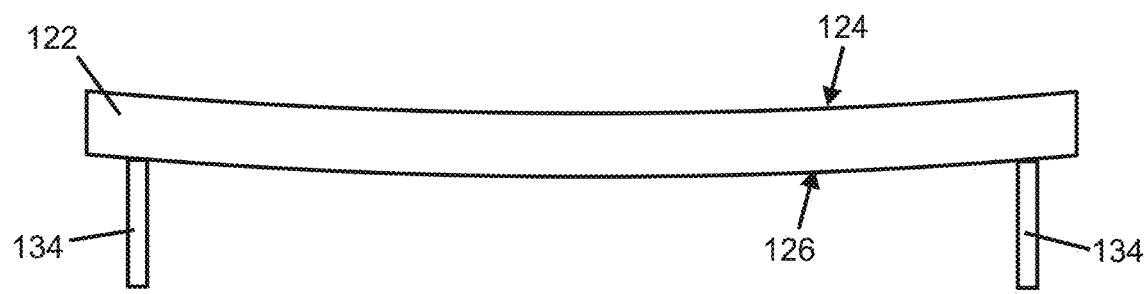
Figure 24C:
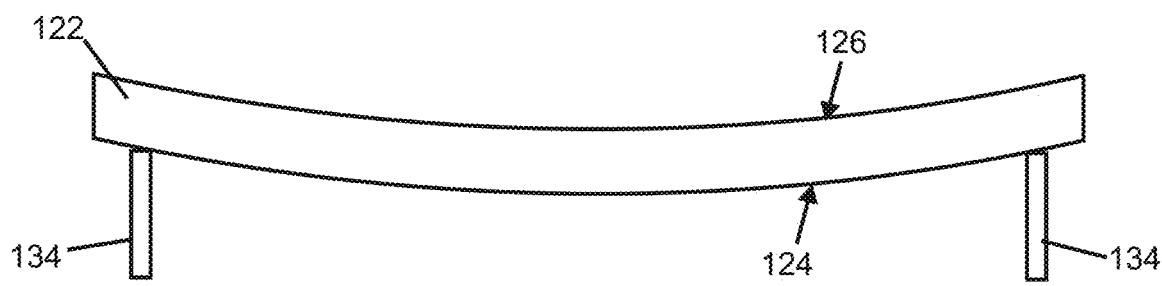

FIGS. 24A-24C are side cross-sectional schematic views of a SiC wafer during edge-supported measurements to quantify relaxed positive bow while correcting for gravitational effects.

Figure 25:
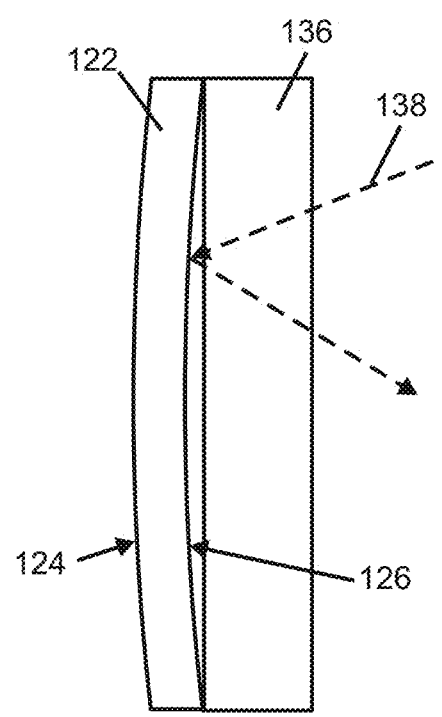

FIG. 25 is a side cross-sectional schematic view of a SiC wafer during vertically-oriented measurements to quantify relaxed positive bow.

Figure 26:
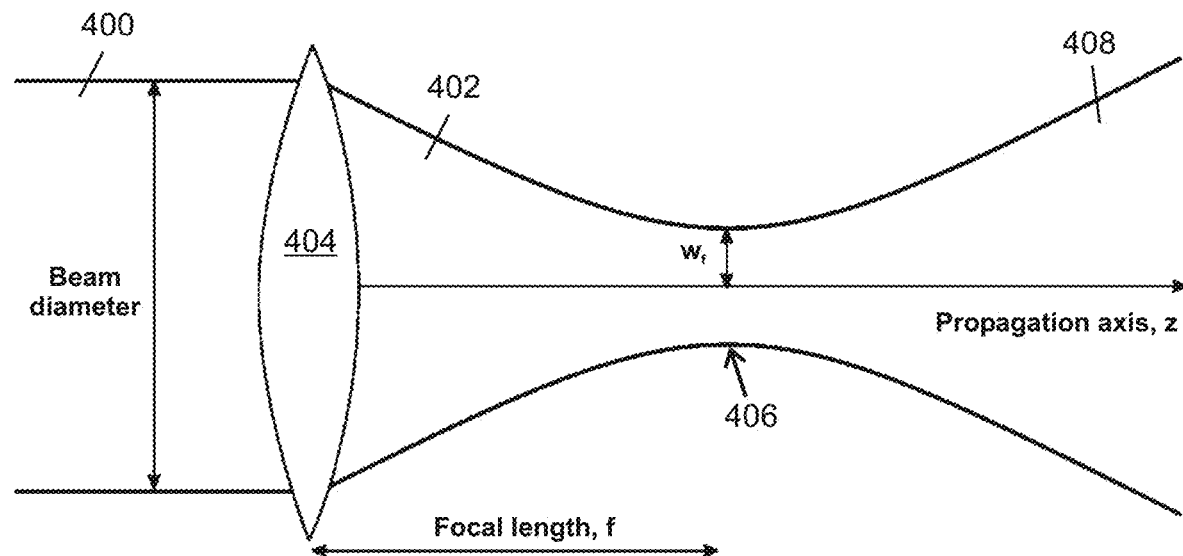

FIG. 26 is a schematic side cross-sectional view of a conventional laser focusing apparatus that focuses an incoming horizontal beam with a lens, forming an outgoing beam having a beam waist pattern having a minimum width at a downstream position corresponding to a focal length of the lens.

Figure 27:
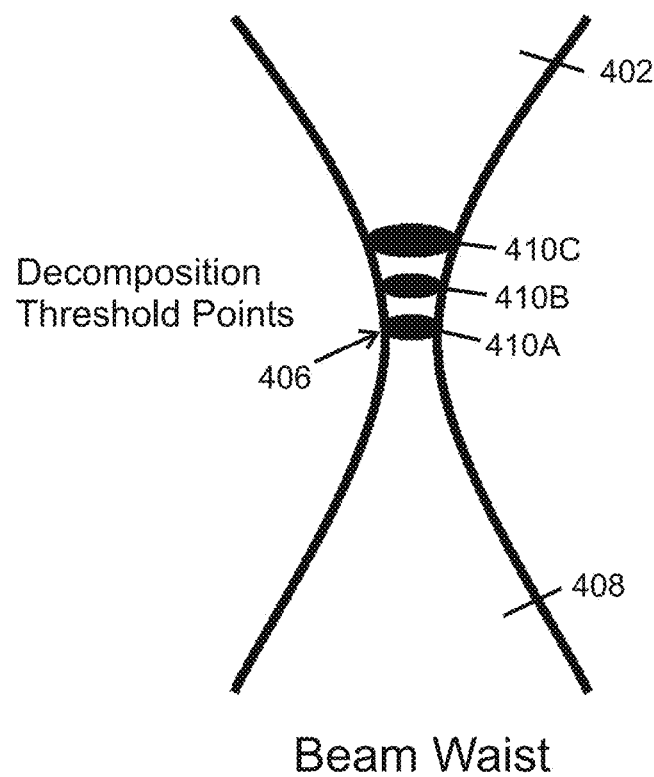

FIG. 27 is a schematic side cross-sectional view of a vertically oriented focused laser beam exhibiting a beam waist within a crystalline material, with illustration of decomposition threshold points at different vertical positions relative to the beam waist.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Silicon carbide (SiC) wafers and related methods are disclosed that include intentional or imposed wafer shapes that are configured to reduce manufacturing problems associated with deformation, bowing, or sagging of such wafers due to gravitational forces or from preexisting crystal stress. In certain embodiments, the intentional or imposed wafer shapes may comprise SiC wafers with a relaxed positive bow from silicon faces thereof. In this manner, effects associated with deformation, bowing, or sagging for SiC wafers, and in particular for large area SiC wafers, may be reduced. In certain embodiments, methods for providing SiC wafers with relaxed positive bow are disclosed that provide reduced kerf losses of bulk crystalline material. Such methods may include laser-assisted separation of SiC wafers from bulk crystalline material.

In this manner, processing techniques are disclosed that provide SiC wafers with intentional or imposed shapes while also providing reduced kerf losses compared with conventional wafer separation and shaping processes.

As used herein, a "substrate" refers to a crystalline material, such as a single crystal semiconductor material, optionally comprising an ingot or a wafer. In certain embodiments, a substrate may have sufficient thickness (i) to be surface processed (e.g., lapped and polished) to support epitaxial deposition of one or more semiconductor material layers, and optionally (ii) to be free-standing if and when separated from a rigid carrier. In certain embodiments, a substrate may have a generally cylindrical or circular shape, and/or may have a thickness of at least about one or more of the following thicknesses: 200 microns (μm), 300 μm, 350 μm, 500 μm, 750 μm, 1 millimeter (mm), 2 mm, 3 mm, 5 mm, 1 centimeter (cm), 2 cm, 5 cm, 10 cm, 20 cm, 30 cm, or more. In certain embodiments, a substrate may include a thicker wafer that is divisible into two thinner wafers. In certain embodiments, a substrate may be part of a thicker substrate or wafer having one or more epitaxial layers (optionally in conjunction with one or more metal contacts) arranged thereon as part of a device wafer with a plurality of electrically operative devices. The device wafer may be divided in accordance with aspects of the present disclosure to yield a thinner device wafer and a second thinner wafer on which one or more epitaxial layers (optionally in conjunction with one or more metal contacts) may be subsequently formed. In certain embodiments, a substrate may comprise a diameter of 150 mm or greater, or 200 mm or greater. In certain embodiments, a substrate may comprise 4H-SiC with a diameter of 150 mm, 200 mm, or greater, and a thickness in a range of 100 to 1000 µm, or in a range of 100 to 800 µm, or in a range of 100 to 600 µm, or in a range of 150 to 500 µm, or in a range of 150 to 400 µm, or in a range of 200 to 500 µm, or in any other thickness range or having any other thickness value specified herein. In certain embodiments, the terms "substrate" and "wafer" may be used interchangeably as a wafer is typically used as a substrate for semiconductor devices that may be formed thereon. As such, a substrate or a wafer may refer to free-standing crystalline material that has been separated from a larger or bulk crystalline material or substrate.

As used herein, "kerf loss" refers to a total amount of material loss associated with forming an individual wafer from bulk crystalline material. The kerf loss may be based on the total width or height of material removed from the bulk crystalline material subtracted by a final thickness of the resulting wafer. The kerf loss may be associated with the separation process of a wafer from bulk crystalline material and with subsequent processing steps applied to the wafer, including grinding or polishing one or more of the wafer surfaces.

As used herein, "positive bow" for a wafer generally refers to a shape that curves, bows, or warps outward from a device face of the wafer, e.g., a convex shape from the device face. As also used herein, a "relaxed positive bow" refers to a positive bow of a wafer that is established while any bending of the wafer due to gravitational forces is ignored. A SiC wafer generally forms a silicon face that opposes a carbon face, with a wafer thickness formed therebetween. In many semiconductor applications, devices are typically formed on the silicon face of the SiC wafer. Wafer bowing, warping, and the like occurs when one or more of the silicon face and the carbon face form surface deviation from a reference plane. As such, positive bow or relaxed positive bow for a SiC wafer generally refers to a shape that curves, bows, or warps outward from the silicon face of the SiC wafer, e.g. a convex shape from the silicon face. In certain embodiments, a shape of the carbon face may correspond to a positive bow or relaxed positive bow of the silicon face of the SiC wafer. In other embodiments, only the silicon face may form a positive bow or a relaxed positive bow.

Wafers for semiconductor applications may be subjected to many different semiconductor device fabrication techniques for forming devices thereon. One such fabrication technique is epitaxial growth of thin films to form device structures, including chemical vapor deposition and metal organic chemical vapor deposition, among others. During epitaxial growth, wafers are typically supported on a susceptor within a growth chamber. The chamber and susceptor are heated to an appropriate temperature such that deposition of thin films occurs on the wafers from decomposed source gases within the growth chamber. During growth, a wafer may be supported in an individual pocket of the susceptor. In particular, the susceptor may provide an edge-supported configuration within the pocket where a wafer is supported by multiple points along a perimeter of the wafer. This configuration provides separation between middle portions of the wafer and a bottom surface of the susceptor that is within the pocket. For larger diameter wafers (e.g., 150 mm or above in certain embodiments) with relatively thin thicknesses (e.g., 800 µm and below), gravitational forces and/or various operating conditions may cause the wafer to sag or otherwise deform toward the bottom surface of the susceptor pocket during processing. In this manner, sagging of the wafer forms a variable distance between the wafer and the susceptor, thereby creating an uneven temperature profile across the wafer during deposition that can contribute to non-uniform growth of thin films thereon. Additionally, other temperature related steps during epitaxy, including cleaning and sublimation steps may also be impacted by wafer sagging.

According to embodiments disclosed herein, SiC wafers and related methods for providing SiC wafers are provided with intentional or imposed shapes that are configured to reduce manufacturing problems associated with deformation or sagging of wafers that may occur from gravitational forces or from preexisting crystal stress within the wafer. The imposed shapes may comprise a SiC wafer with a relaxed positive bow from the silicon face. For epitaxial growth applications, the silicon face of the SiC wafer may therefore be configured to initially curve away from a susceptor and subsequent sagging of the wafer may position the silicon face to have a more planar configuration with the susceptor during growth, thereby improving uniformity of epitaxial layers grown thereon. In certain embodiments, a method of separating a SiC wafer from a bulk crystalline material comprises forming laser subsurface damage within the bulk crystalline material and subsequently separating the SiC wafer from the bulk crystalline material along the laser subsurface damage. In certain embodiments, the shape of the resulting SiC wafer is at least partially determined by the shape of the laser subsurface damage region formed. For example, laser subsurface damage may be provided in a curved manner within the bulk crystalline material such that when separated, the wafer is formed with a relaxed positive bow from the silicon face. In this manner, processing techniques are disclosed that provide SiC wafers with intentional or imposed shapes while also providing reduced kerf losses compared with conventional wafer separation and shaping processes.

Methods disclosed herein may be applied to substrates or wafers of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Exemplary materials include, but are not limited to, Si, GaAs, and diamond. In certain embodiments, such methods may utilize single crystal semiconductor materials having hexagonal crystal structure, such as 4H-SiC, 6H-SIC, or Group III nitride materials (e.g., GaN, AlN, InN, InGaN, AlGaN, or AlInGaN). Various illustrative embodiments described hereinafter mention SiC generally or 4H-SiC specifically, but it is to be appreciated that other suitable crystalline materials may be used. Among the various SiC polytypes, the 4H-SiC polytype is particularly attractive for power electronic devices due to its high thermal conductivity, wide bandgap, and isotropic electron mobility. Bulk SiC may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming N-doped or highly conductive material). Embodiments disclosed herein may apply to on-axis and off-axis crystalline materials, as well as doped and unintentionally doped crystalline semiconductor materials. In certain embodiments, crystalline material may include single crystal material. Certain embodiments disclosed herein may utilize on-axis 4H-SiC or vicinal (off-axis) 4H-SiC having an offcut in a range of from 1 to 10 degrees, or from 2 to 6 degrees, or about 4 degrees.

FIGS. 6A, 6B, and 6C schematically illustrate on-axis and off-axis bulk crystalline material in the form of ingots that may be utilized with methods disclosed herein. FIG. 6A is a side elevation schematic view of an on-axis ingot 15 of crystalline material having first and second end faces 16, 17 that are perpendicular to the c-direction (i.e., the [0001] direction for a hexagonal crystal structure material such as 4H-SiC). FIG. 6B is a side elevation schematic view of the ingot 15 of FIG. 6A being rotated by four degrees, with a superimposed pattern 18 (shown in dashed lines) for cutting and removing end portions of the ingot 15 proximate to the end faces 16, 17. FIG. 6C is a side elevation schematic view of an off-axis ingot 15A formed from the ingot 15 of FIG. 6B, following removal of end portions to provide new first and second end faces 16A, 17A that are non-perpendicular to the c-direction. If laser emissions of a first depth are supplied through the end face 16 of the ingot 15 to form subsurface laser damage, a carrier (not shown) is joined to the end face 16, and the ingot 15 is fractured along the subsurface laser damage, then an on-axis wafer may be formed. Conversely, if laser emissions of a first depth are supplied through the end face 16A of the off-axis ingot 15A to form subsurface laser damage, a carrier (not shown) is joined to the end face 16A, and the ingot 15A is fractured along the subsurface laser damage, then an off-axis wafer may be formed.

Tools for forming laser subsurface damage in crystalline materials are known in the art and commercially available from various providers, such as Disco Corporation (Tokyo, Japan). Such tools permit laser emissions to be focused within an interior of a crystalline material substrate, and enable lateral movement of a laser relative to the substrate. Typical laser damage patterns in the art include formation of parallel lines that are laterally spaced relative to one another at a depth within a crystalline substrate. Parameters such as focusing depth, laser power, translation speed, and subsurface damage line spacing may be adjusted to impart laser damage, but adjustment of certain factors involves tradeoffs. Increasing laser power tends to impart greater subsurface damage that may enhance ease of fracturing (e.g., by reducing the stress required to complete fracturing), but greater subsurface damage increases surface irregularities along surfaces exposed by fracturing, such that additional processing may be required to render such surfaces sufficiently smooth for subsequent processing (e.g., for incorporation in electronic devices), and the additional processing leads to additional kerf losses. Reducing lateral spacing between subsurface laser damage lines may also enhance ease of fracturing, but a reduction in spacing between laser damage lines increases the number of translational passes between a substrate and a laser, thereby reducing tool throughput.

FIG. 7 is a perspective view schematic of one example of a laser tool 29 configured to focus laser emissions within an interior of a crystalline material 30 to form subsurface damage 40. The crystalline material 30 includes an upper surface 32 and an opposing lower surface 34, and the subsurface damage 40 is formed in the interior of the crystalline material 30 between the upper and lower surfaces 32, 34. Laser emissions 36 are focused with a lens assembly 35 to yield a focused beam 38, with a focal point thereof being in the interior of the crystalline material 30. Such laser emissions 36 may be pulsed at any suitable frequency (typically in the nanosecond, picosecond, or femtosecond range) and beam intensity, with a wavelength below the bandgap of the crystalline material 30 to permit the laser emissions 36 to be focused at a targeted depth below a surface thereof. At the focal point, the beam size and short pulse width results in an energy density high enough to result in very localized absorption that forms subsurface damage. One or more properties of the lens assembly 35 may be altered to adjust a focal point of the focused beam 38 to a desired depth within the crystalline material 30. Relative lateral motion (e.g., lateral translation) between the lens assembly 35 and the crystalline material 30 may be effected to propagate the subsurface damage 40 in a desired direction, as schematically illustrated by dashed line 42. Such lateral movement may be repeated in various patterns, including patterns as described hereinafter.

FIGS. 8A and 8B provide exemplary laser tool travel paths relative to a crystalline material for formation of subsurface damage within the crystalline material. In certain embodiments, a laser tool portion (e.g., including a lens assembly) may be configured to move while a crystalline material is stationary; in other embodiments, a laser tool portion may be held stationary while a crystalline material is moved relative to the tool portion. FIG. 8A shows a reversing y-direction linear scanning movement 46 suitable for forming subsurface damage in a pattern of laterally spaced parallel lines within a first crystalline material 45A. FIG. 8B shows a y-direction linear scanning movement 48 over (and beyond) an entire surface of a second crystalline material 45B (with slight advancement in an x-direction upon each reversal in the y-direction), sufficient to form parallel subsurface laser damage lines distributed through the crystalline material 45B. As shown, the laser damage lines are perpendicular to the [11$\bar{2}$0] direction of a hexagonal crystal structure of the crystalline material 45B along a surface of the crystalline material 45B, and are and substantially parallel to the surface of the crystalline material 45B. In certain embodiments, additional subsurface laser damage lines may be interspersed with the parallel subsurface laser damage lines. In other embodiments, various combinations and patterns of subsurface laser damage lines and interspersed subsurface laser damage lines may be provided.

Coverage of an entire surface of a crystalline material with laser lines formed in a y-direction, with unidirectional advancement in an x-direction following each y-direction reversal, may be referred to as a single pass of laser damage formation. In certain embodiments, laser processing of crystalline material to form subsurface damage may be performed in two, three, four, five, six, seven, or eight passes, or any other suitable number of passes. Increasing the number of passes at lower laser power can reduce kerf losses. To achieve a desirable balance of material loss versus process speed, desirable numbers of laser subsurface damage formation passes have been found to be two to five passes, or three to four passes, prior to performance of a fracturing step.

In certain embodiments, lateral spacing between adjacent laser subsurface damage lines (whether formed in a single pass or multiple passes) may be in a range including 80 to 400 µm, or including 100 to 300 µm, or including 125 to 250 µm. Lateral spacing between adjacent laser subsurface damage lines impacts laser processing time, ease of fracture, and (depending on c-plane orientation or misorientation) effective laser damage depth.

It has been observed that forming subsurface laser damage lines in crystalline material results in formation of small cracks in the interior of the material propagating outward (e.g., laterally outward) from the laser damage lines. Such cracks appear to extend substantially or predominantly along the c-plane. The length of such cracks appears to be functionally related to laser power level (which may be calculated as the product of pulse frequency times energy per pulse). For adjacent laser subsurface damage lines spaced apart by a specific distance, it has been observed that increasing laser power in forming such laser subsurface damage lines tends to increase the ability of cracks to connect or join between the laser subsurface damage lines, which is desirable to promote ease of fracturing.

If the crystalline material subject to laser damage formation includes an off-axis (i.e., non c-plane) orientation (e.g., in a range of from 0.5-10 degrees, 1-5 degrees, or another misorientation), such misorientation may affect desirable laser damage line spacing.

A SiC substrate may include surfaces that are misaligned, e.g., off-axis at an oblique angle relative to the c-plane. An off-axis substrate may also be referred to as a vicinal substrate. After fracturing such a substrate, the as-fractured surface may include terraces and steps (which may be smoothed thereafter by surface processing such as grinding and polishing). FIG. 9 is a perspective view schematic of a surface structure of an off-axis 4H-SiC crystal 50 (having an angle A relative to a c-axis basal plane 56) after fracture but prior to smoothing. The fractured surface exhibits steps 52 and terraces 54 relative to the c-axis basal plane 56. For a 4 degree off-axis surface, steps theoretically have a height of about 17 µm for a terrace width of 250 µm. For a 4H-SiC crystal having subsurface laser damage, 250 µm spacing between laser lines forms terraces of 250 µm width. After fracturing, the stepped surface is subject to being ground smooth, planarized, and polished in preparation for epitaxial growth of one or more layers thereon.

When subsurface laser damage is formed in crystalline material (e.g., SiC), and if subsurface laser damage lines are oriented away from perpendicular to a substrate flat (i.e., non-perpendicular to the [11$\bar{2}$0] direction), then such laser damage lines extend through multiple steps and terraces in a manner equivalent to off-axis semiconductor material. For purposes of subsequent discussion, the term "off-axis laser subsurface damage lines" will be used to refer to laser subsurface damage lines that are non-perpendicular to the [11$\bar{2}$0] direction.

Providing spacing that is too large between adjacent subsurface laser damage lines inhibits fracture of crystalline material. Providing spacing that is too small between adjacent subsurface laser damage lines tends to reduce step heights, but increases the number of vertical steps, and increasing the number of vertical steps typically requires greater separation force to complete fracturing.

Reducing spacing between adjacent laser damage lines to a distance that is too small may yield diminishing returns and substantially increase processing time and cost. A minimum laser energy threshold is required for SiC decomposition. If this minimum energy level creates connected cracks between two laser lines spaced about 100 µm apart, then reducing laser line spacing below this threshold likely offers little benefit in terms of reducing kerf loss.

Surface roughness of crystalline material exposed by fracturing can impact not only subsequent handling such as robot vacuum, but also grind wheel wear, which is a primary consumable expense. Roughness is impacted by both the spacing of subsurface laser damage lines and orientation of such subsurface damage lines relative to the crystal structure of the semiconductor material. Reducing a gap between subsurface damage lines simply reduces potential step height. Providing off-axis laser subsurface damage lines tends to break up the long parallel steps that would otherwise be present at the laser damage region, and it also helps mitigate at least some impact from c-plane slope or curvature. When the laser lines are perpendicular to the flat of a substrate, the cleave plane parallel to the laser lines along the c-plane extends about 150 mm from the flat to the opposing curved end of the wafer. Slight deviations in the c-plane slope or curvature (which are common for SiC substrates) can create significant variability in the fractured surface as it forces plane jumping as a fracture propagates. A drawback to providing off-axis laser subsurface damage lines is that such subsurface damage lines generally require laser power to be increased to form connected cracks between adjacent laser lines. Thus, in certain embodiments, forming a combination of on-axis subsurface laser damage lines (that are perpendicular to the primary flat) and off-axis laser subsurface damage lines provides a good balance between avoiding excessive variability in the fractured surface without requiring unduly increased laser power to form connected cracks between adjacent laser lines.

In certain embodiments, a laser having a wavelength of 1064 nanometers (nm) may be used to implement methods disclosed herein, with the inventors having gained experience in processing of 4H-SiC. Although a wide range of pulse frequencies may be used in certain embodiments, pulse frequencies of 120 kilohertz (kHz) to 150 kHz have been successfully employed. A translation stage speed of 936 millimeters per second (mm/s) between a laser and a substrate to be processed has been successfully utilized; however, higher or lower translation stage speeds may be used in certain embodiments with suitable adjustment of laser frequency to maintain desirable laser pulse overlap. Average laser power ranges for forming subsurface laser damage in doped SiC material are in a range of from 3 watts (W) to 8 W, and 1 W to 4 W for undoped SiC material. Laser pulse energy may be calculated as power divided by frequency. Laser pulse widths of 3 ns to 4 ns may be used, although other pulse widths may be used in other embodiments. In certain embodiments, a laser lens Numerical Aperture (NA) in a range of 0.3 to 0.8 may be used. For embodiments directed to processing of SiC, given the refractive index change going from air (~1) to SiC (~2.6), a significant change in refractive angle is experienced inside SiC material to be processed, making laser lens NA and aberration correction important to achieving desirable results.

In certain embodiments, a semiconductor material processing method as disclosed herein may include some or all of the following items and/or steps. A second carrier wafer may be attached to a bottom side of a crystalline material substrate (e.g., ingot). Thereafter, a top side of the crystalline material substrate may be ground or polished, such as to provide an average surface roughness Ra of less than about 5 nm to prepare the surface for transmitting laser energy. Laser damage may then be imparted at a desired depth or depths within the crystalline material substrate, with spacing and direction of laser damage traces optionally being dependent on crystal orientation of the crystalline material substrate. A first carrier may be bonded to a top side of the crystalline material substrate. An identification code or other information linked to the first carrier is associated with a wafer to be derived from the crystalline material substrate. Alternatively, laser marking may be applied to the wafer (not the carrier) prior to separation to facilitate traceability of the wafer during and after fabrication. The crystalline material substrate is then separated or fractured along a subsurface laser damage region to provide a portion of the semiconductor material substrate bound to the first carrier, and a remainder of the crystalline material substrate being bound to the second carrier. Both the removed portion of the semiconductor material substrate and the remainder of the semiconductor material substrate are ground smooth and cleaned as necessary to remove residual subsurface laser damage. The removed portion of the semiconductor material substrate may be separated from the carrier. Thereafter, the process may be repeated using the remainder of the semiconductor material substrate.

Figure 10A:
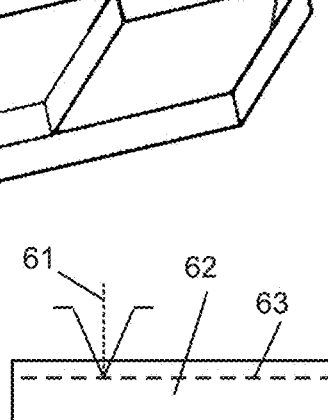
Figure 10B:
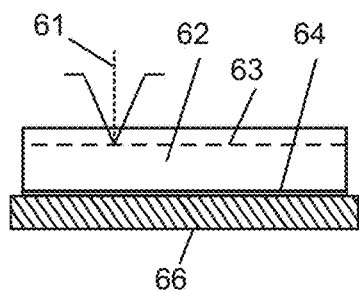
Figure 10C:
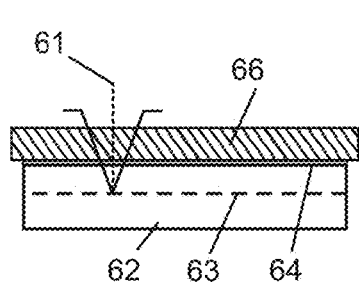
Figure 10D:
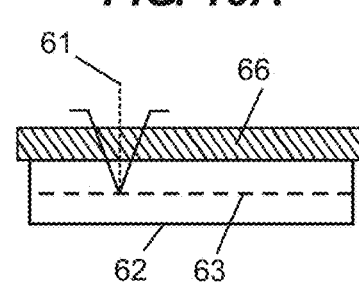

In certain embodiments, laser subsurface damage may be formed in a crystalline material substrate prior to bonding the substrate to a rigid carrier. In certain embodiments, a rigid carrier that is transparent to laser emissions of a desired wavelength may be bonded to a crystalline material substrate prior to subsurface laser damage formation. In such an embodiment, laser emissions may optionally be transmitted through a rigid carrier and into an interior of the crystalline material substrate. Different carrier-substrate subsurface laser formation configurations are shown in FIGS. 10A-10D. FIG. 10A is a schematic view of laser emissions 61 being focused through a surface of a bare substrate 62 to form subsurface laser damage 63 within the substrate 62, whereby a rigid carrier may be affixed to the substrate 62 following formation of the subsurface laser damage. FIG. 10B is a schematic view of laser emissions 61 being focused through a surface of a substrate 62 to form subsurface laser damage 63 within the substrate 62, with the substrate 62 having previously been bonded using adhesive material 64 to a rigid carrier 66. FIG. 10C is a schematic view of laser emissions 61 being focused through a rigid carrier 66 and adhesive 64 to form subsurface laser damage 63 within a substrate 62 previously bonded to the rigid carrier 66. In certain embodiments, a surface of the substrate 62 distal from the rigid carrier 66 may include one or more epitaxial layers and/or metallization layers, with the substrate 62 embodying an operative electrical device prior to formation of the subsurface laser damage 63. FIG. 10D is a schematic view of laser emissions 61 being focused through a rigid carrier 66 into a substrate 62 (without an intervening adhesive layer) to form subsurface laser damage 63 within the substrate 62 previously bonded (e.g., via anodic bonding or other adhesiveless means) to the rigid carrier 66.

In certain embodiments, initial subsurface laser damage centered at a first depth may be formed within an interior of a crystalline material substrate, and additional subsurface laser damage centered at a second depth may be formed within an interior of a substrate, wherein the additional subsurface laser damage is substantially registered with the initial subsurface laser damage, and a vertical extent of at least a portion of the additional subsurface laser damage overlaps with a vertical extent of at least a portion of the initial laser damage. Restated, one or more subsequent passes configured to impart laser damage at a different depth may be added on top of one or more prior passes to provide subsurface laser damage with an overlapping vertical extent.

In certain embodiments, addition of overlapping subsurface damage may be performed responsive to a determination (e.g., by optical analysis) prior to fracturing that one or more prior subsurface laser damage formation steps were incomplete. Formation of overlapping subsurface laser damage at different depths may be performed in conjunction with any other method steps herein, including (but not limited to) formation of multiple interspersed subsurface laser damage patterns.

FIG. 11 is a cross-sectional schematic view of a bulk crystalline material 70 including a first subsurface laser damage pattern 72 formed relative to a first surface 74 of the bulk crystalline material 70, with the first subsurface laser damage pattern 72 produced by focused emissions of a laser 76. The first subsurface laser damage pattern 72 is formed by a plurality of laser damage regions 72', each which has a vertical extent 78 that remains within an interior of the bulk crystalline material 70 between the first surface 74 and an opposing second surface 80. In certain embodiments, the bulk crystalline material 70 comprises bulk SiC where the first surface 74 comprises a carbon face of the bulk crystalline material 70 and the second surface 80 comprises a silicon face of the bulk crystalline material 70. As illustrated, the first subsurface laser damage pattern 72 may be formed with a nonlinear shape. In particular, the first subsurface laser damage pattern 72 is illustrated with a curved shape within the bulk crystalline material 70. In this manner, when the bulk crystalline material 70 is separated along the first subsurface laser damage pattern 72, a shape of the silicon face of the resulting SiC wafer will at least partially be defined by the first subsurface laser damage pattern 72. For example, the curved shape of the first subsurface laser damage pattern 72 may provide a relaxed positive bow from the silicon face of the resulting SiC wafer.

FIG. 12 is a cross-sectional schematic view of the bulk crystalline material 70 of FIG. 11 following formation of a second subsurface laser damage pattern 82 centered at a different depth and registered with the first subsurface laser damage pattern 72, wherein a vertical extent 84 of the second subsurface laser damage pattern 82 overlaps with the vertical extent 78 of the first subsurface laser damage pattern 72 in a damage overlap region 86. In certain embodiments, subsequent fracturing of the bulk crystalline material 70 may be performed along or through the damage overlap region 86 to at least partially form a SiC wafer with a relaxed positive bow from the silicon face. In certain embodiments, additional manufacturing steps, such as grinding or polishing, may be applied to the first surface 74 after separation to provide a resulting SiC wafer where both the silicon face and the carbon face comprise similar nonlinear shapes.

In certain embodiments, subsurface laser damage lines may be formed at different depths in a substrate without being registered with other (e.g., previously formed) subsurface laser damage lines and/or without vertical extents of initial and subsequent laser damage being overlapping in character. In certain embodiments, an interspersed pattern of subsurface laser damage may include groups of laser lines wherein different groups are focused at different depths relative to a surface of a substrate. In certain embodiments, a focusing depth of emissions of a laser within the interior of the substrate differs among different groups of laser lines (e.g., at least two different groups of first and second groups, first through third groups, first through fourth groups, etc.) by a distance in a range from about 2 μm to about 5 μm (i.e., about 2 μm to about 5 μm). After forming the subsurface laser damage within a bulk crystalline material, a fracturing process as disclosed herein (e.g., cooling a CTE mismatched carrier, application of ultrasonic energy, and/or application of mechanical force) is applied to fracture the bulk crystalline material along the subsurface laser damage region, causing a crystalline material portion to be separated from a remainder of the bulk crystalline material.

FIG. 13 is a cross-sectional schematic view of a portion of bulk crystalline material 92 showing subsurface laser damage 94 with superimposed dashed lines identifying an anticipated kerf loss material region 104. The anticipated kerf loss material region 104 includes the subsurface laser damage 94, plus material 106 to be mechanically removed (e.g., by grinding and polishing) from a lower face or surface 108 (e.g., silicon-terminated face) of a crystalline material portion 102 (e.g., SiC wafer) to be separated from the bulk crystalline material 92, plus material 109 to be mechanically removed (e.g., by grinding and polishing) from a surface 90A (e.g., carbon-terminated face) of a remainder of the bulk crystalline material 92A. The lower face or surface 108 of the crystalline material portion 102 opposes a first face or surface 90 thereof. In certain embodiments, the entire kerf loss material region 104 may have a thickness that is less than 250 μm for SiC.

FIG. 14 is a cross-sectional schematic view of a portion of the bulk crystalline material 92 showing curved subsurface laser damage 94 with superimposed dashed lines identifying the anticipated kerf loss material region 104. As illustrated, the subsurface laser damage 94 is arranged with a nonlinear (e.g. curved) profile across the bulk crystalline material 92 to provide a SiC wafer with a relaxed positive bow after separation. After separation, one or more surfaces of the SiC wafer as well as surfaces of the remaining bulk crystalline material 92 may be subjected to polishing or grinding to remove damage associated with the separation process. In certain embodiments, the anticipated kerf loss material region 104 may be similar to planar configurations illustrated in FIG. 13. As such, the entire kerf loss material region 104 may have a thickness that is less than 250 μm for SiC. Whereas wire sawing of SiC wafers typically entails kerf losses of at least about 250 μm per individual wafer separated from a bulk crystalline material, laser- and carrier-assisted separation methods disclosed herein and applied to SiC may achieve kerf losses of less than 250 μm; or less than 175 μm; or in a range including 100 to 250 μm; or in a range including 80 to 250 μm per wafer; or in a range including 80 to 140 μm per wafer. In particular, for SiC wafers with imposed shapes, conventional methods typically involve wire cutting thicker portions of SiC material and subsequently forming a desired shape with grinding, polishing, or other mechanical material removal processes. According to embodiments disclosed herein, SiC wafers may be separated from bulk crystalline material 90 with imposed shapes at least partially determined by the shape of the subsurface laser damage 94 and the subsequent separation process while providing desirably low kerf losses.

According to embodiments disclosed herein, subsurface laser damage with various nonlinear profiles or shapes, including curved, may be provided within bulk crystalline material in a variety of manners. In certain embodiments, a laser power used to form the subsurface laser damage may be variably applied across bulk crystalline material to form curved subsurface laser damage. In other embodiments, a focal point or height of a laser used to form the subsurface laser damage may be variably adjusted across the crystalline material to form curved subsurface laser damage. In still other embodiments, a bulk crystalline material may be formed with a variable doping profile that alters laser absorption across the bulk crystalline material. In particular, a doping concentration may be formed that is generally higher at a center of the bulk crystalline material than at a perimeter of the bulk crystalline material. As subsurface laser damage is formed, laser absorption differences due to changes in the doping concentration may form curved subsurface laser damage. In certain embodiments, methods may comprise one or more combinations of variable laser power, variable laser focal point or height, and variable doping profiles of the bulk crystalline material to form shaped subsurface laser damage regions.

FIG. 15 is cross-sectional schematic view of laser emissions 61 with variable laser power being focused across a portion of the bulk crystalline material 92 to form a curved shape 110 of subsurface laser damage. As illustrated, the laser emissions 61 are configured with a first laser power P1 near a perimeter of the bulk crystalline material 92 and a second laser power P2 near a center of the bulk crystalline material 92. In certain embodiments, the second laser power P2 is configured to be greater than the first laser power P1, thereby forming deeper subsurface laser damage in regions of the bulk crystalline material 92 that are registered with the second laser power P2. While only two laser powers P1, P2 are illustrated in FIG. 15, any number of laser powers may be provided across the bulk crystalline material 92 to form the curved shape 110 of subsurface laser damage. Depending on the laser tool, targeted wafer thickness and the material properties of the bulk crystalline material, the average laser power may be configured to vary in a range including 2 W to 6 W or in a range including 3 W to 5.5 W. In certain embodiments, higher or lower power ranges may be used. Additionally, the curved shape 110 of subsurface laser damage is illustrated in FIG. 15; however, other shapes of subsurface laser damage may be formed depending on how the laser power is varied across the bulk crystalline material 92.

FIG. 16 is cross-sectional schematic view of laser emissions 61 with variable height adjustment being focused across a portion of the bulk crystalline material 92 to form the curved shape 110 of subsurface laser damage. As illustrated, the laser emissions 61 are configured with heights (e.g., "Z" position of the laser focal point) that vary from a first laser height Z1 near a perimeter of the bulk crystalline material 92 and a second laser height Z2 near a center of the bulk crystalline material 92. In certain embodiments, the second laser height Z2 is configured to provide deeper subsurface laser damage in the bulk crystalline material 92 than the first laser height Z1. The variable laser heights Z1, Z2 may be provided by adjusting the laser focal point position Z relative to the surface of the bulk crystalline material 92 and/or optical elements within the laser lens to move the focal point to the targeted depth for formation of subsurface laser damage in the bulk crystalline material 92. While the curved shape 110 of subsurface laser damage is illustrated in FIG. 16, other shapes of subsurface laser damage may be formed depending on how the laser height or focal point is varied across the bulk crystalline material 92.

FIG. 17 is cross-sectional schematic view of laser emissions 61 being focused across a variably doped portion of the bulk crystalline material 92 to form the curved shape 110 of subsurface laser damage. A simple doping profile plot is provided below the cross-sectional schematic view of the bulk crystalline material 92. The y-axis represents the relative doping concentration (ccn) within the bulk crystalline material 92 while the x-axis represents lateral position of the bulk crystalline material 92. As illustrated, the doping of the bulk crystalline material 92 is configured to have a radial doping profile that is higher near a center of the bulk crystalline material 92 and lower near a perimeter of the bulk crystalline material 92. Accordingly, as the laser emissions 61 are passed along the bulk crystalline material 92, the laser emissions 61 may exhibit laser absorption levels that vary with respect to horizontal position within the bulk crystalline material 92, thereby forming the curved shape 110 of subsurface laser damage. The variable doping profile of the bulk crystalline material 92 may be provided during crystal growth of the bulk crystalline material 92. In certain embodiments, the bulk crystalline material 92 is arranged with a center doping ring of higher doping concentration. While the curved shape 110 of subsurface laser damage is illustrated in FIG. 17, other shapes of subsurface laser damage may be formed depending on how the doping profile is arranged within the bulk crystalline material 92.

FIGS. 18-21 illustrate various views of bulk crystalline materials having variable doping profiles. FIG. 18 is a side cross-sectional schematic view of bulk crystalline material 92 of SiC on a seed crystal 112, showing a cylindrically shaped higher doping region 114 extending upward from the seed crystal 112 through the entire thickness of the bulk crystalline material 92 along a central portion thereof. In certain embodiments, the higher doping region 114 is laterally bounded by a lower doping region 116 that is arranged along a perimeter of the bulk crystalline material 92. In certain embodiments, the lower doping region 116 may be intentionally doped, unintentionally doped, or undoped. Although FIG. 18 shows the size (e.g., width or diameter) of the higher doping region 114 as being substantially constant throughout the thickness of the bulk crystalline material 92, the size of a doping region can vary with vertical position within the bulk crystalline material 92 (e.g., typically being larger in width or diameter closer to a seed crystal, and smaller with increasing distance away from the seed crystal). Additionally, a magnitude of doping within the higher doping region 114 can vary with vertical position in the bulk crystalline material 92. A thin cross-sectional portion 118 of the bulk crystalline material 92 is indicated in dashed lines and may define a SiC wafer 120, as shown in FIG. 19. FIG. 19 is a top schematic view of the SiC wafer 120 derived from the bulk crystalline material 92 of FIG. 18 along the cross-sectional portion 118. As illustrated, the higher doping region 114 forms a circular shape within the perimeter of the ring-shaped lower doping region 116 of the SiC wafer 120. In such embodiments, a variable subsurface laser damage region may be provided along the cross-sectional portion 118 of FIG. 18 to provide the SiC wafer 120 with a relaxed positive bow as previously described.

FIG. 20 is a side cross-sectional schematic view of bulk crystalline material 92 of SiC on the seed crystal 112, showing a frustoconically shaped higher doping region 114 extending upward from the seed crystal 112 through the entire thickness of the bulk crystalline material 92 along a central portion thereof. In certain embodiments, the lateral position and shape of the higher doping region 114 can differ relative to the configuration shown in FIG. 20 if a vicinal (e.g., offcut at an angle non-parallel to c-plane) seed crystal is used for growth of the bulk crystalline material 92. For example, if a vicinal seed crystal is used, then the higher doping region 114 may be more oval than round in shape, and/or may be offset laterally relative to a center of the bulk crystalline material 92. FIG. 21 is a side cross-sectional schematic view of bulk crystalline material 92 of SiC on the seed crystal 112, showing a frustoconically shaped higher doping region 114 extending upward from the seed crystal 112 at a non-centered position relative to a center of the seed crystal 112 and upward through the entire thickness of the bulk crystalline material 92. In FIG. 21, the seed crystal 112 may comprise a vicinal (e.g., offcut) seed crystal and the higher doping region 114 may form a generally oval shape when viewed from above. As is evidenced by the variable shapes of the higher doping regions 114 of FIGS. 20 and 21, lateral dimensions of the higher doping region 114 and the lower doping region 116 can vary depending on vertical position within the bulk crystalline material 92. In this manner, in order to uniformly produce multiple SiC wafers having the same relaxed positive bow, laser conditions (e.g., one or more of the focal point height and the laser power) used to form subsurface laser damage regions may need to be altered to compensate for the vertical changes in the higher and lower doping regions 114, 116.

FIG. 22 is a side cross-sectional schematic view of a SiC wafer 122 with a relaxed positive bow according to embodiments disclosed herein. The SiC wafer 122 includes a silicon face 124 and an opposing carbon face 126. As illustrated, the SiC wafer 122 is formed with a relaxed positive bow from the silicon face 124 according to previously described fabrication techniques. Notably, the carbon face 126 is formed with a similar or parallel shaped bow. In certain embodiments, combinations of one or more of laser subsurface damage and subsequent grinding or polishing may form such corresponding shapes of the silicon face 124 and the carbon face 126. A theoretical flat wafer 128 is superimposed on the SiC wafer 122 with dashed lines. The amount of relaxed positive bow of the silicon face 124 may be quantified by a distance or deviation 130 at a highest point (e.g., the center in FIG. 22) of the silicon face 124 as compared with a silicon face 124' of the theoretical flat wafer 128 without the influence of gravity. In a similar manner, bow of the carbon face 126 may be quantified as a distance or deviation from a carbon face 126' of the theoretical flat wafer 128.

FIG. 23 is a side cross-sectional schematic view of a SiC wafer 132 with a relaxed positive bow according to embodiments disclosed herein. The SiC carbide wafer 132 includes the silicon face 124 and the opposing carbon face 126. As illustrated, the SiC wafer 132 is formed with a relaxed positive bow from the silicon face 124 according to previously described fabrication techniques, while the carbon face 126 is formed with a generally planar profile. In this manner, a profile of the silicon face 124 that is defined by the relaxed positive bow differs from the profile of the carbon face 126 such that the SiC wafer 132 comprises local thickness variation from a perimeter of the SiC wafer 132 to a thicker central portion of the SiC wafer 132. In certain embodiments, combinations of one or more of laser subsurface damage and subsequent grinding or polishing may form such shapes of the silicon face 124 and the carbon face 126. As described for FIG. 22, the amount of relaxed positive bow of the silicon face 124 may be quantified by the distance or deviation 130 at a highest point of the silicon face 124 as compared with the silicon face 124' of the theoretical flat wafer 128 without the influence of gravity.

Various techniques may be used to measure amounts of relaxed positive bow of wafers according to embodiments disclosed herein. Such techniques include arrangements to correct for gravity-induced deformation or sagging of wafers. One such measurement technique, as described in the Semiconductor Equipment and Materials International (SEMI) standard MF1390 titled "Test Method for Measuring Warp on Silicon Wafers by Automated Non-Contact Scanning," is used to correct for gravitational effects by comparing first wafer measurements with inverted second wafer measurements such that the difference between the two corresponds to gravitational effects. Other measurement techniques may be found in SEMI standard 3D4-0915 titled "Guide for Metrology for Measuring Thickness, Total Thickness Variation (TTV), Bow, Warp/Sori, and Flatness of Bonded Wafer Stacks," which describes various gravity compensation techniques for horizontally and vertically supported wafers. In certain embodiments, such measurement techniques may include interferometry. In certain embodiments, measurement techniques may include the use of an optical flat that is used to determine flatness, or lack thereof, of wafers.

FIGS. 24A-24C are side cross-sectional schematic view of the SiC wafer 122 of FIG. 22 during measurements to quantify relaxed positive bow while correcting for gravitational effects. FIG. 24A is a side cross-sectional schematic view of the SiC wafer 122 of FIG. 22 that forms a relaxed positive bow from the silicon face 124, opposite the carbon face 126 without gravitational effects. In FIG. 24B, the SiC wafer 122 is arranged on an edge support 134 for wafer bow or warp characterization. In certain embodiments, the edge support 134 is arranged in a manner to approximate how the SiC wafer 122 may be supported during subsequent device fabrication processes, included epitaxial growth of thin films on the SiC wafer 122. The edge support 134 may comprise any number of configurations, including a three-point support, a four-point support, or a continuous ring for support. As illustrated, when the SiC wafer 122 is arranged on the edge support 134, gravitational effects can cause the SiC wafer 122 to deform, bow, or sag in a direction from the silicon face 124 toward the carbon face 126. Notably, with the influence of gravity, the relaxed positive bow as illustrated in FIG. 24A can form a flattened, or even convex shape of the silicon face 124. Such a configuration may be desirable for providing improved temperature uniformity of the SiC wafer 122 during epitaxial device growth as previously described. In FIG. 24C, the SiC wafer 122 is flipped or inverted such that the silicon face 124 is oriented down toward the edge support 134 and the carbon face 126 is oriented up. As illustrated, gravitational effects can cause the SiC wafer 122 to deform, bow or sag a greater amount than what is shown in FIG. 24B. In this regard, wafer bow or warp characterization measurements may be taken from both the silicon face 124 and the carbon face 126 of the SiC wafer 122 and compared to compensate for the gravitational effects. For example, if the measured amount of sagging from the silicon face 124 (e.g., FIG. 24B) is equal to the measured amount of sagging from the carbon face 126 (e.g., FIG. 24C), then the SiC wafer 122 may be characterized as generally flat or having no relaxed positive bow. Accordingly, if the measured amount of sagging from the silicon face 124 (e.g., FIG. 24B) is less than the measured amount of sagging from the carbon face 126 (e.g., FIG. 24C), then the SiC wafer 122 may be characterized as having a relaxed positive bow that is quantifiable as the difference between the two measurements and is compensated for gravitational effects during measurement.

FIG. 25 is a side cross-sectional schematic view of the SiC wafer 122 of FIG. 22 during vertically-oriented measurements to quantify relaxed positive bow. As illustrated, the SiC wafer 122 is vertically arranged on an optical flat 136 for characterization. During flatness measurements, the optical flat 136 and the SiC wafer 122 are illuminated with light 138, such as monochromatic light or white light, among others, and interference fringes are formed that are used to quantify flatness of the SiC wafer 122 relative to the optical flat 136. As the SiC wafer 122 is vertically oriented during characterization, gravitational effects are reduced.

In certain embodiments a relaxed positive bow is in a range from greater than 0 μm to 50 μm, or in a range from greater than 0 μm to 40 μm, or in a range from greater than 0 μm to 25 μm, or in a range from greater than 0 μm to 15 μm, or in a range from greater than 0 μm to 10 μm, or in a range from 5 μm to 50 μm. For certain applications, a relaxed positive bow of greater than 50 μm may result in wafers that maintain a positive bow during subsequent fabrication steps, such as epitaxial growth, that can have a negative effect on device uniformity. As previously described, SiC wafers as disclosed herein may comprise a diameter of at least 100 mm, at least 150 mm, at least 200 mm or greater, or in a range including 150 mm to 205 mm and a thickness in a range of 100 to 1000 μm. In certain embodiments a SiC wafer comprises a diameter to thickness ratio of at least 250; or at least 300; or at least 400; or in a range including 250 to 1020. In certain examples, a 6 inch (152.4 mm) SiC wafer comprises a thickness of 200 μm (0.2 mm) for a diameter to thickness ratio of 762; or a thickness of 350 μm (0.35 mm) for a diameter to thickness ratio of 435 (rounded); or a thickness of 500 μm (0.5 mm) for a diameter to thickness ratio of 305 (rounded). In other examples, an 8 inch (203.2 mm) SiC wafer comprises a thickness of 200 μm (0.2 mm) for a diameter to thickness ratio of 1016; or a thickness of 500 μm (0.5 mm) for a diameter to thickness ratio of 406 (rounded); or a thickness of 800 μm (0.8 mm) for a diameter to thickness ratio of 254. Each of the 6 inch and 8 inch SiC wafer examples above may be arranged with a relaxed positive bow according to embodiments described above. In certain embodiments, the amount of relaxed positive bow may be arranged differently based on wafer diameter and thickness dimensions. In one example, a 6 inch (152.4 mm) SiC wafer with a thickness of 350 μm (0.35 mm) may comprise a relaxed positive bow in a range including 8 μm to 16 μm to compensate for sagging, warping, or other deformation effects. For a same wafer thickness, relaxed positive bow may be increased with increasing wafer diameter. For example, an 8 inch (203.2 mm) SiC wafer with a thickness of 350 μm (0.35 mm) may comprise a relaxed positive bow in a range including 30 μm to 50 μm to compensate for sagging, warping, or other deformation effects. For a same wafer diameter, relaxed positive bow may be decreased with increasing wafer thickness. For example, an 8 inch (203.2 mm) SiC wafer with a thickness of 500 μm (0.5 mm) may comprise a relaxed positive bow in a range including 10 μm to 30 μm, and an 8 inch (203.2 mm) SiC wafer with a thickness of 800 μm (0.8 mm) may comprise a relaxed positive bow in a range including 4 μm to 12 μm to compensate for sagging, warping, or other deformation effects. In certain embodiments, other relaxed positive bow ranges are possible, depending on the material type, and/or material dimensions (e.g., thickness and diameter), and/or crystalline stress that may be present. In this regard, large area SiC wafers with thicknesses described above are disclosed with relaxed positive bow, thereby reducing sagging, warping, or other deformation effects associated with gravitational influence or from preexisting crystal stress for SiC wafers with such dimensions.

As noted previously herein, progressively higher laser power levels may be necessary for formation of laser damage sufficient to part crystalline material by fracturing, starting at a position distal from the seed crystal and obtaining wafers at cross-sectional positions progressively approaching the seed crystal. Use of high laser power at each sequential depth position when forming subsurface damage would entail unnecessary material loss, and would also significantly increase wafer-to-wafer thickness spread due to variability in both the damage depth and the point at which decomposition is reached relative to a laser beam waist. Such concept may be understood with reference to FIGS. 26 and 27.

FIG. 26 is a schematic side cross-sectional view of a conventional laser focusing apparatus that focuses an incoming horizontal beam 400 in a propagation direction with a lens 404, forming an outgoing beam 402 having a beam waist pattern having a minimum width $W_f$ at a position 406 corresponding to a focal length f of the lens 404. Downstream of this position 406, the beam width broadens to a wider region 408. FIG. 27 is a schematic side cross-sectional view of a vertically oriented focused laser beam 402 that may be directed into a crystalline material and exhibits a beam waist pattern (with a minimum width at a position 406 corresponding to a focal length of a lens (not shown)), with the beam width broadening thereafter to a wider region 408. When the focused laser beam 402 is directed within a bulk crystalline material, the crystalline material will thermally decompose at different threshold points (i.e., depths) depending on factors such as laser power, degree of absorption of radiation by the crystalline material (which may be influenced by presence or absence of dopants and/or crystal defects that may vary with depth (and width) position within the substrate), and degree of focusing which is dependent on vertical position. Three different decomposition threshold points 410A-410C are shown in FIG. 27.

Methods and apparatuses disclosed herein permit the foregoing issues to be addressed by imaging a top surface of a crystalline material having subsurface laser damage to detect uncracked regions, analyzing one or more images to identify a condition indicative of presence of uncracked regions within the crystalline material, and taking one or more actions responsive to the analyzing (e.g., upon attainment of appropriate conditions). Such actions may include performing an additional laser pass at the same depth position and/or changing an instruction set for producing subsurface laser damage at subsequent depth positions. Such methods and apparatuses facilitate production of substrate or wafer portions with imposed shapes and without unnecessary material loss.

Technical benefits that may be obtained by one or more embodiments of the disclosure may include: formation of wafers with relaxed positive bow from device faces and reduced crystalline material kerf losses compared to conventional techniques; reduced processing time and increased throughput of crystalline material wafers and resulting devices; and/or increased reproducibility of thin wafers with relaxed positive bow that are separated from bulk crystalline material.

Those skilled in the art will recognize improvements and modifications to the preferred embodiments of the present disclosure. All such improvements and modifications are considered within the scope of the concepts disclosed herein and the claims that follow.

What is claimed is:

1. A silicon carbide (SiC) wafer comprising:
a silicon face and a carbon face;
a diameter of at least 200 millimeters (mm); and
a relaxed positive bow from the silicon face.

2. The SiC wafer of claim 1, wherein the relaxed positive bow is in a range from greater than 0 µm to 50 µm.

3. The SiC wafer of claim 1, wherein the relaxed positive bow is in a range from greater than 0 µm to 40 µm.

4. The SiC wafer of claim 1, wherein the relaxed positive bow is in a range from greater than 0 µm to 15 µm.

5. The SiC wafer of claim 1, wherein the relaxed positive bow is in a range including 30 µm to 50 µm.

6. The SiC wafer of claim 1, wherein the relaxed positive bow is in a range including 8 µm to 16 µm.

7. The SiC wafer of claim 1, wherein the SiC wafer comprises an n-type conductive SiC wafer.

8. The SiC wafer of claim 1, wherein the SiC wafer comprises a semi-insulating SiC wafer.

9. The SiC wafer of claim 1, wherein the SiC wafer comprises an unintentionally doped SiC wafer.

10. The SiC wafer of claim 1, wherein the carbon face of the SiC wafer comprises a shape that corresponds to the relaxed positive bow from the silicon face.

11. The SiC wafer of claim 1, wherein a profile of the silicon face that is defined by the relaxed positive bow differs from a profile of the carbon face of the SiC wafer.

12. The SiC wafer of claim 1, wherein the SiC wafer is provided with a kerf loss of less than 250 µm.

13. The SiC wafer of claim 1, wherein the diameter is in a range from 200 mm to 205 mm.

14. A silicon carbide (SiC) wafer comprising:
a silicon face and a carbon face; and
a relaxed positive bow from the silicon face, wherein the relaxed positive bow is provided with a kerf loss of less than 250 µm.

15. The SiC wafer of claim 14, wherein the kerf loss is less than 175 µm.

16. The SiC wafer of claim 14, wherein the kerf loss is in a range from 100 µm to 250 µm.

17. The SiC wafer of claim 14, wherein the kerf loss is in a range from 80 µm to 140 µm.

18. A silicon carbide (SiC) wafer comprising a silicon face, a carbon face, a diameter of at least 200 mm, and a relaxed positive bow from the silicon face, wherein the SiC wafer is formed by a process of separating the SiC wafer from a SiC bulk crystalline material along a subsurface laser damage pattern.

19. The SiC wafer of claim 18, wherein the relaxed positive bow is in a range from greater than 0 µm to 50 µm.

20. The SiC wafer of claim 18, wherein the relaxed positive bow is in a range including 30 um to 50 um.

21. The SiC wafer of claim 18, wherein the carbon face of the SiC wafer comprises a shape that corresponds to the relaxed positive bow from the silicon face.

22. The SiC wafer of claim 18, wherein a profile of the silicon face that is defined by the relaxed positive bow differs from a profile of the carbon face of the SiC wafer.

23. The SiC wafer of claim 18, wherein the SiC wafer is provided with a kerf loss of less than 250 µm.

24. The SiC wafer of claim 18, wherein the diameter is in a range from 200 mm to 205 mm.

* * * * *